United States Patent
Hyung

(10) Patent No.: US 12,400,958 B2
(45) Date of Patent: Aug. 26, 2025

(54) METHOD FOR FORMING SEMICONDUCTOR DEVICE HAVING AN AIR GAP BETWEEN A CONTACT PAD AND A SIDEWALL OF CONTACT HOLE

(71) Applicant: Fujian Jinhua Integrated Circuit Co., Ltd., Fujian (CN)

(72) Inventor: Yong Woo Hyung, Fujian (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/743,155

(22) Filed: Jun. 14, 2024

(65) Prior Publication Data

US 2024/0339405 A1  Oct. 10, 2024

Related U.S. Application Data

(62) Division of application No. 17/521,849, filed on Nov. 8, 2021, now Pat. No. 12,057,396.

(30) Foreign Application Priority Data

Nov. 25, 2020  (CN) .......................... 202011338461.1
Nov. 25, 2020  (CN) .......................... 202022770473.3

(51) Int. Cl.
  *H01L 21/768*  (2006.01)
  *H01L 23/528*  (2006.01)
  *H10D 62/10*  (2025.01)

(52) U.S. Cl.
  CPC .... *H01L 23/5283* (2013.01); *H01L 21/76895* (2013.01); *H10D 62/115* (2025.01)

(58) Field of Classification Search
  CPC ......... H01L 21/28525; H01L 21/76895; H01L 21/76897; H01L 23/5283; H10D 62/115; H10B 12/0335; H10B 12/315; H10B 12/482
  USPC ....................................................... 438/262
  See application file for complete search history.

(56) References Cited

U.S. PATENT DOCUMENTS 6,239,029 B1    5/2001  Honeycutt et al.
2018/0342520 A1*  11/2018  Chun ..................... H10D 1/716

FOREIGN PATENT DOCUMENTS

CN           104103577 A    10/2014

\* cited by examiner

*Primary Examiner* — Hoai V Pham

(57) ABSTRACT

Disclosed are a semiconductor device and a method for preparing a semiconductor device. The semiconductor device is provided with contact pad structures in contact holes. Each of the contact pad structures is configured to comprise a first contact pad, a second contact pad adaptively covering the first contact pad, and a contact plug located on the second contact pad. The first contact pad is in full contact with an active region in a substrate. In addition, an air gap is formed between the first contact pad and a side wall on a side of the respective contact hole.

10 Claims, 21 Drawing Sheets

METHOD FOR FORMING SEMICONDUCTOR DEVICE HAVING AN AIR GAP BETWEEN A CONTACT PAD AND A SIDEWALL OF CONTACT HOLE

CROSS-REFERENCE TO RELATED APPLICATIONS

The present application is a divisional application of U.S. patent application Ser. No. 17/521,849, which claims the priority of Chinese patent application No. 202022770473.3, filed on Nov. 25, 2020 and entitled "Semiconductor device", and the priority of Chinese patent application No. 202011338461.1, filed on Nov. 25, 2020 and entitled "Semiconductor device and method for preparing semiconductor device", which are incorporated herein by reference in their entirety.

FIELD OF THE INVENTION

The present disclosure relates to the field of semiconductors, and in particular to a semiconductor device and a method for preparing a semiconductor device.

BACKGROUND OF THE INVENTION

With the development of technology, the level of integration of a semiconductor device gradually increases in order to satisfy a requirement for miniaturization of the semiconductor device. The increase of the level of integration requires a reduction in the dimension of a contact hole in the semiconductor device. A smaller contact hole will have a larger aspect ratio, and it will be difficult to control a morphology of a bottom part of the contact hole during a preparation process, causing deformation and oxidization of the contact hole. As a result, when a contact pad structure is formed in a contact hole having a larger aspect ratio, a bottom part of the contact pad structure and an active region exposed by the contact hole have poor contact, and the conductivity is relatively poor, thereby greatly affecting performance of a semiconductor device.

SUMMARY OF THE INVENTION

The technical problem to be solved by the present invention is how to realize effective contact between a contact pad structure and an active region in a semiconductor device with a contact hole having a larger aspect ratio to greatly improve a conductivity characteristic of the semiconductor device.

In order to solve the above-mentioned technical problem, the present disclosure provides a semiconductor device and a method for preparing a semiconductor device.

The first aspect of the present disclosure provides a semiconductor device, which may include:
  a substrate including at least an active region and a shallow trench isolation region;
  bit line structures located on the substrate and extending in a first direction;
  isolation fences located between adjacent bit line structures and arranged at intervals in the first direction;
  contact holes located in an area defined by adjacent bit line structures in a second direction and adjacent isolation fences in the first direction, where the second direction is perpendicular to the first direction, a bottom part of each of the contact holes extends into the substrate and at least exposes part of the active region and part of the shallow trench isolation region; and
  a contact pad structure located in a respective contact hole, and including a first contact pad, a second contact pad adaptively covering the first contact pad, and a contact plug located on the second contact pad, where an air gap is formed between the first contact pad and a side wall on a side of the respective contact hole.

The second aspect of the present disclosure provides a method for preparing a semiconductor device, which may include:
  forming, on a substrate, bit line structures extending in a first direction, where the substrate includes at least an active region and a shallow trench isolation region, the bit line structures are arranged at intervals in a second direction, and the second direction is perpendicular to the first direction;
  etching the substrate between adjacent bit line structures to form a contact opening that extends into the substrate and at least expose part of the active region and part of the shallow trench isolation region;
  forming isolation fences in the contact opening, wherein the isolation fences are arranged at intervals in the first direction to isolate the contact opening into a plurality of contact holes;
  performing, by using a germane gas, pretreatment on a bottom part of each of the contact holes;
  forming a first contact pad in a respective contact hole that has been subjected to the pretreatment;
  forming, on the first contact pad, a second contact pad adaptively covering the first contact pad, where an air gap is formed between the first contact pad and a side wall on a side of the respective contact hole; and
  forming, in the contact holes, contact plugs, respectively.

BRIEF DESCRIPTION OF THE DRAWINGS

The scope of the present disclosure will be better understood from reading the following detailed description of exemplary embodiments in conjunction with the accompanying drawings. In the accompanying drawings.

DETAILED DESCRIPTION OF THE EMBODIMENTS

In order to make the objects, technical solutions and advantages of the present disclosure clearer, the implementations of the present disclosure will be described in details below in conjunction with the accompanying drawings and embodiments, so as to fully understand and implement the implementation process of how to apply technical means to solve technical problems and achieve technical effects.

With the development of technology, the level of integration of a semiconductor device gradually increases in order to satisfy a requirement for miniaturization of the semiconductor device. The increase of the level of integration requires a reduction in the dimension of a contact hole in the semiconductor device. A smaller contact hole will have a larger aspect ratio, and it will be difficult to control a morphology of a bottom part of the contact hole during a preparation process, causing deformation and oxidization of the contact hole. As a result, when a contact pad structure is formed in a contact hole having a larger aspect ratio, a bottom part of the contact pad structure and an active region exposed by the contact hole have poor contact, and the conductivity is relatively poor, thereby greatly affecting performance of a semiconductor device.

Thus, the present disclosure provides a semiconductor device and a method for preparing a semiconductor device. The semiconductor device is provided with contact pad structures in contact holes. Each of the contact pad structures is configured to include a first contact pad, a second contact pad adaptively covering the first contact pad, and a contact plug located on the second contact pad. The first contact pad is in full contact with an active region in a substrate, which can effectively reduce contact resistance. Moreover, by providing contact pads in the form of a stacking structure, each of the first contact pads can function as a buffer layer for a respective second contact pad so as to avoid doped ions in the second contact pad from penetrating into the substrate and affecting conductivity. In addition, an air gap in each contact hole is formed between the first contact pad and a side wall on a side of the contact hole, which can effectively reduce an influence of the air gap on the conductivity, thereby facilitating significant improvement of a conductivity characteristic of the semiconductor device.

Embodiment One

Figure 1:
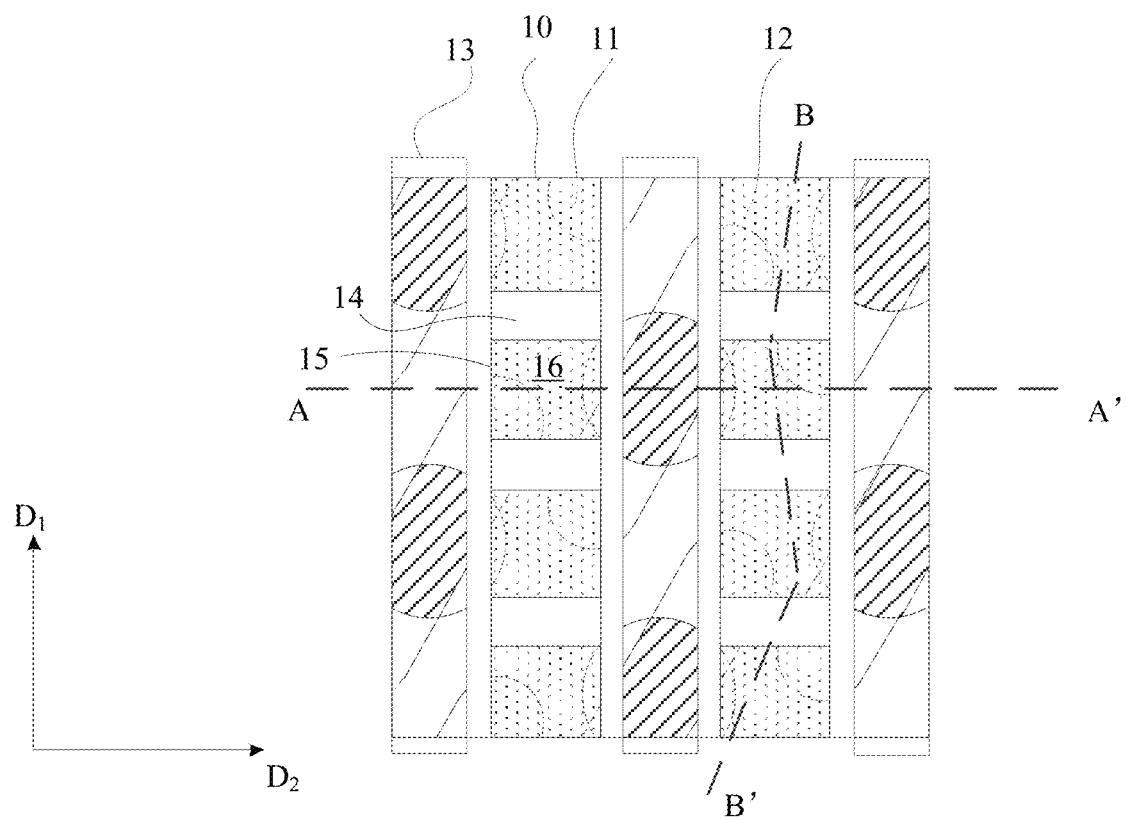
FIG. 1 is a schematic top structural view of a semiconductor device provided in an embodiment of the present disclosure.

With reference to FIG. 1, there is shown a schematic top structural view of a semiconductor device provided in an embodiment of the present disclosure. The semiconductor device includes a substrate 10, bit line structures 13, isolation fences 14, contact holes and contact pad structures 16.

The substrate 10 includes at least an active region 11 and a shallow trench isolation region 12.

The bit line structures 13 are located on the substrate 10 and extend in a first direction.

The isolation fences 14 are located between adjacent bit line structures 13 and arranged at intervals in the first direction.

The contact holes 15 are located in an area defined by adjacent bit line structures 13 in a second direction and adjacent isolation fences 14 in the first direction. The second direction is perpendicular to the first direction. A bottom part of each of the contact holes 15 extends into the substrate 10 and at least exposes part of the active region 11 and part of the shallow trench isolation region 12.

The contact pad structures 16 are located in the respective contact holes 15. Each of the contact pad structures 16 includes a first contact pad 161, a second contact pad 162 adaptively covering the first contact pad 161, and a contact plug 163 located on the second contact pad 162. An air gap 17 is formed between the first contact pad 161 and a side wall on a side of the respective contact hole 15.

The substrate 10 may include a semiconductor substrate. As a specific example, the substrate 10 may include a silicon substrate, a silicon-germanium substrate or a silicon substrate on an insulator. The substrate 10 may include the active region 11 and the shallow trench isolation region 12, and the shallow trench isolation region 12 may define the active region 11 into a plurality of areas.

In the embodiment of the present disclosure, the first direction may be represented by D1, and the second direction perpendicular to the first direction may be represented by D2. The bit line structures 13 extend in the direction D1, and the plurality of bit line structures are arranged at intervals in the direction D2.

Figure 2A:
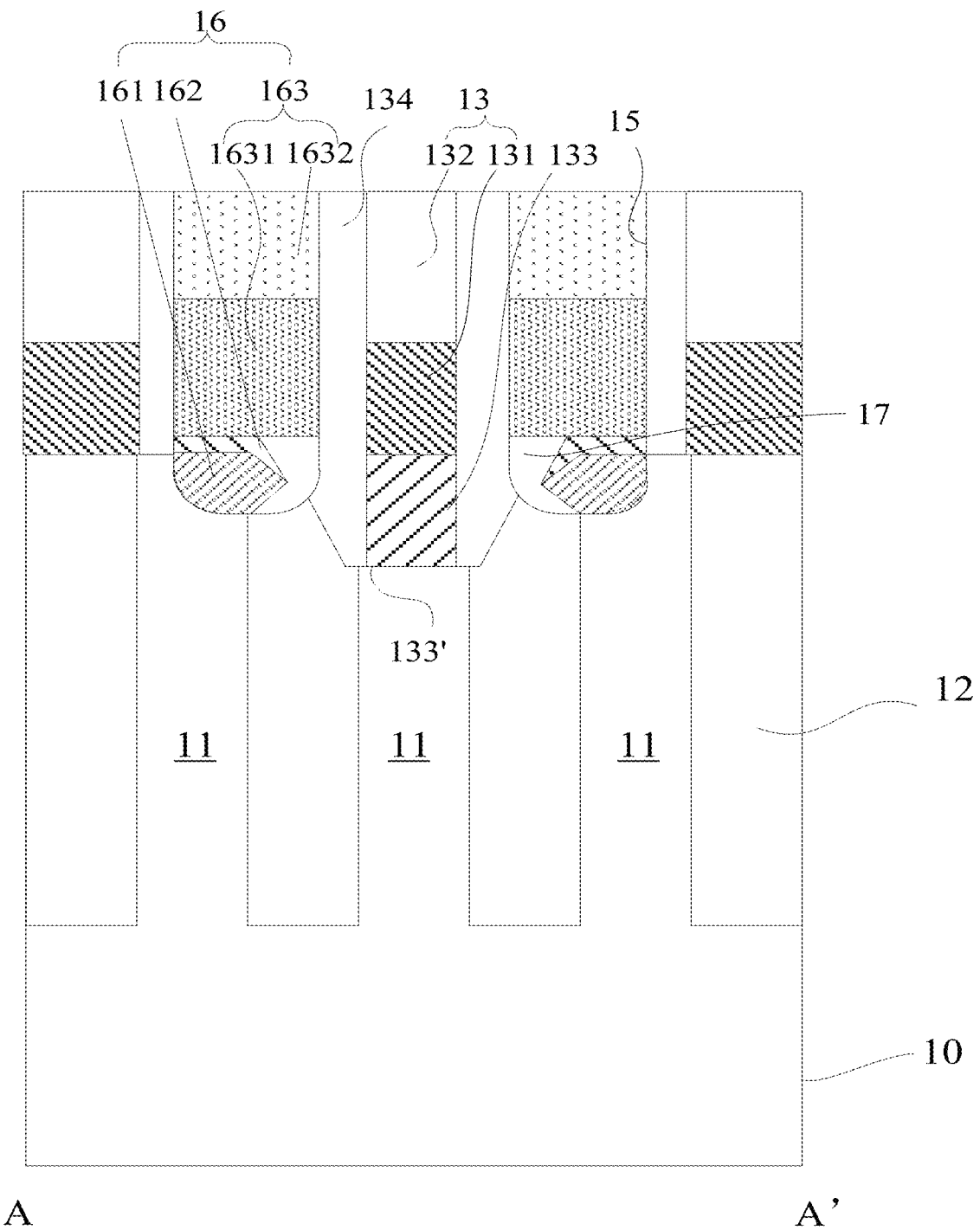
FIG. 2A is a schematic cross-sectional structural view along a line A-A' in FIG. 1 as provided in an embodiment of the present disclosure.
Figure 2B:
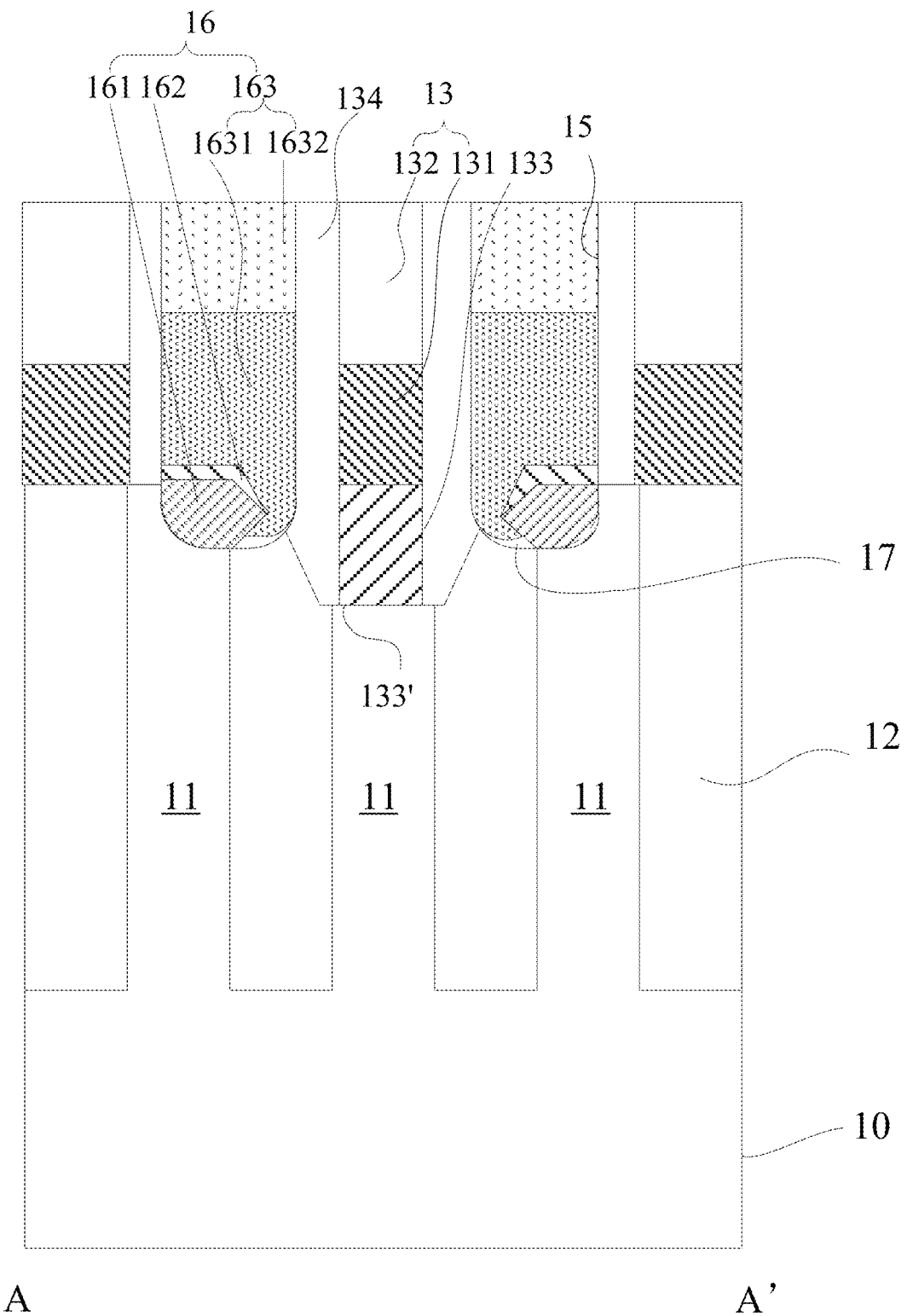
FIG. 2B is a schematic cross-sectional structural view along the line A-A' in FIG. 1 as provided in another embodiment of the present disclosure.

As an example, each of the bit line structures 13 may include a bit line 131 and a hard mask layer 132 located on the bit line 131. Some of the bit line structures 13 may be in contact with the substrate 10 by means of bit line contact plugs 133. The bit line contact plugs 133 are arranged in respective bit line contact holes 133' inside the substrate 10, and each of the bit line contact holes 133' may have a transverse size greater than that of each of the bit line contact plugs 133. In addition, bit line spacers 134 may also be provided, each of which may adaptively cover a respective bit line structure 13 and fill in an air gap between a respective bit line contact plug 133 and a respective bit line contact hole 133'. An upper surface of the bit line contact plug 133 has the same height as an upper surface of the substrate 10. Referring particularly to FIG. 2A or 2B, FIG. 2A shows a schematic cross-sectional structural view along a line A-A' in FIG. 1 as provided in an embodiment of the present disclosure, and FIG. 2B shows a schematic cross-sectional structural view along the line A-A' in FIG. 1 as provided in another embodiment of the present disclosure. It should be noted that the size of the air gap 17 is enlarged in FIGS. 2A and 2B for convenience of view, and the size of the air gap 17 is not specifically limited.

As an example, the isolation fences 14 may be formed by depositing an insulation material. Specifically, the isolation fences 14 may be formed by depositing silicon nitride.

Figure 3:
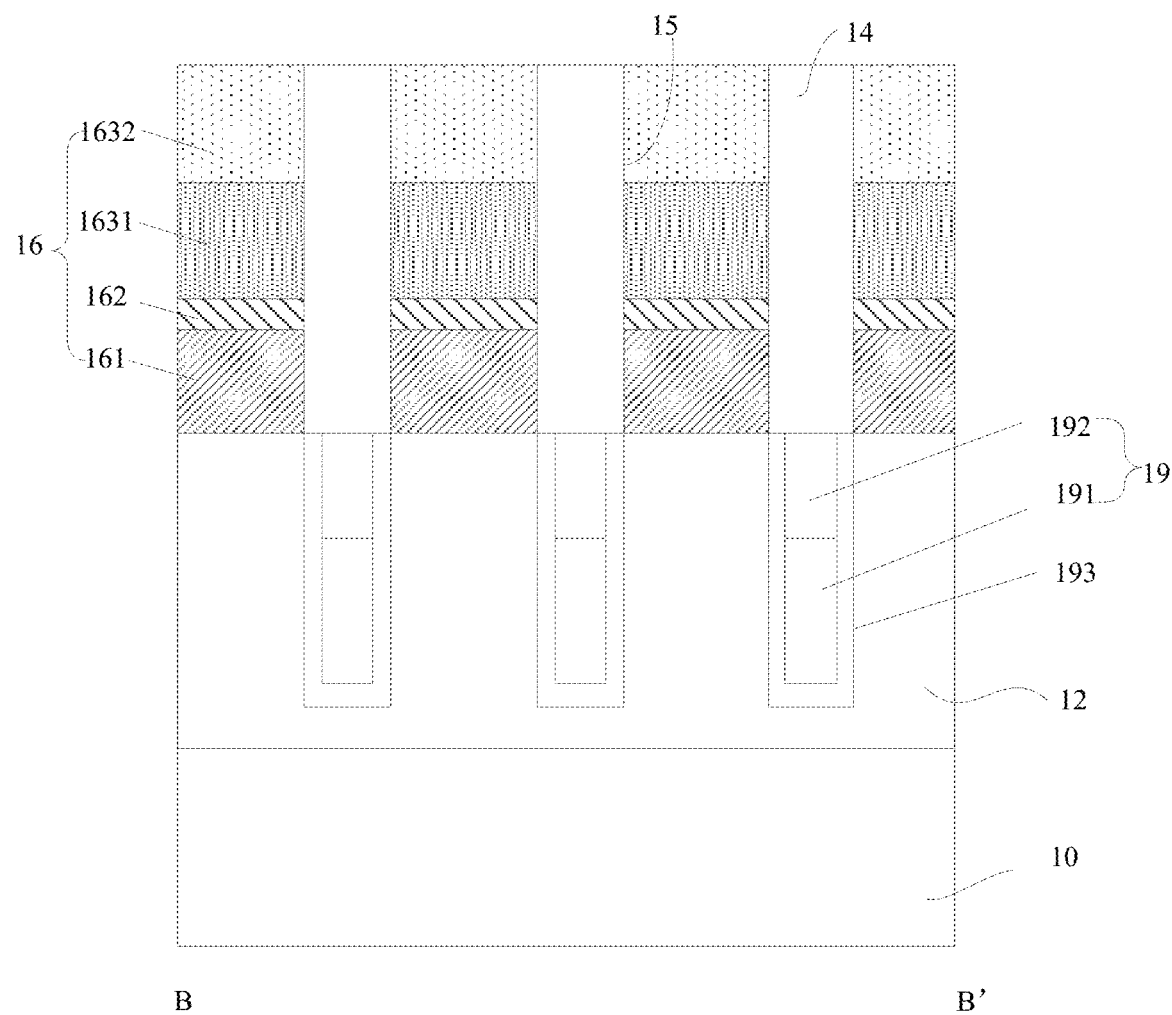
FIG. 3 is a schematic cross-sectional structural view along a line B-B' in FIG. 1 as provided in an embodiment of the present disclosure.

It should be noted that the isolation fences 14 may be formed before the contact holes 15 are formed, and may also be formed after the contact holes are formed. In the embodiment of the present disclosure, description is provided as the isolation fences 14 are formed after the contact holes 15 are formed. Referring particularly to FIG. 3, there is shown a schematic cross-sectional structural view along a line B-B' in FIG. 1 as provided in an embodiment of the present disclosure.

Referring back to FIG. 2A or 2B, the contact pad structures 16 are located in the respective contact holes 15. As an example, pretreatment may be performed on each of the contact holes 15 by using a germane gas before a respective first contact pad 161 is deposited, to remove impurities on an upper surface of the active region 11, so that the first contact pad 161 and the active region 11 are in good contact, thereby improving conductivity. The first contact pad 161 is then formed, by means of chemical vapor deposition, physical vapor deposition or the like, in a respective contact hole 15 that has been subjected to the pretreatment. It is possible to control, by means of selecting a suitable deposition condition, the first contact pad 161 to be in contact with part of a substrate surface of the respective contact hole 15. As one example, the first contact pad 161 may be in contact with part of a surface of each of the active region 11 and the shallow trench isolation region 12 in the respective contact hole 15 (not shown in the figures). As another example, the first contact pad 161 may be formed, by a selective epitaxial growth process, on the active region 11 in the respective contact hole 15 that has been subjected to the pretreatment. The first contact pad 161 is only in contact with the active region 11.

In addition, in the embodiment of the present disclosure, a polygonal first contact pad 161 having a planer top surface may be formed by controlling growth rates in different directions. In another embodiment, it is also possible to form a first contact pad 161 having an air gap between the same and a side wall on a side of a respective contact hole 15 and having an approximately elliptic cross-section. The first contact pad 161 may include a silicon germanium layer, and may also be an n-doped silicon germanium layer.

The second contact pad 162 adaptively covers the first contact pad 161. As an example, the second contact pad 162 may be formed on an upper surface of the first contact pad 161 by a selective epitaxial growth process, and an upper surface of the second contact pad 162 may be higher than a lower surface of the bit line structure 13.

The second contact pad 162 and the first contact pad 161 have different chemical compositions. For example, the second contact pad 162 may be formed from a material different from that of the first contact pad 161, and the second contact pad 162 may also be formed from the same material as that of the first contact pad 161 but with a different ion doping concentration. As a specific example, the second contact pad 162 may include a silicon phosphide layer.

The first contact pad 161 is formed by using the selective epitaxial growth process, and a bottom part of the first contact pad 161 is only in contact with the active region 11. After the second contact pad 162 is formed by using the selective epitaxial growth process, an air gap is formed between each of the first contact pad 161 and the second contact pad 162 and a side wall on a side of a respective contact hole 15. In such a structure, the first contact pad 161 may function as a buffer layer for the second contact pad 162, avoiding doped ions in the second contact pad 162 from penetrating into the substrate and affecting conductivity. Moreover, the air gap 17 in the contact hole 15 is located between the first contact pad 162 and a side wall on a side of the contact hole 15, which can effectively reduce an influence of the air gap 17 on the conductivity, thereby greatly improving performance of a semiconductor device.

In the embodiment of the present disclosure, since the first contact pad 161 is in contact with part of the substrate surface of the contact hole 15, an air gap will be formed between the first contact pad 161 and each of a side wall on a side of the respective contact hole 15 and a bottom surface of the respective contact hole 15 after the first contact pad 161 and the second contact pad 162 are both formed, and such an air gap may not be able to be completely filled when the contact plug 163 is subsequently formed by using a depositing process. As an example, the contact plug 163 may be formed on the second contact pad 162 by means of a chemical vapor deposition process or a physical vapor deposition process. Process conditions are controlled in such a way that the contact plug 163 only covers part of the surface of the respective second contact pad 162, and the air gap 17 is formed between each of the first contact pad 161 and the second contact pad 162 and the respective contact hole 15, as depicted in FIG. 2A for details.

As another example, the contact plug 163 may be formed on the respective second contact pad 162 by choosing a depositing process with a better step coverage characteristic, such that the contact plug 163 covers the second contact pad 162 and is in contact with part of the respective first contact pad 161, the air gap between each of the first contact pad 161 and the second contact pad 162 and the respective contact hole 15 is partially filled, and the air gap 17 is still reserved between the first contact pad 161 and a bottom part of the contact hole 15, as depicted in FIG. 2B for details.

As an example, the contact plug 163 may comprise a first contact insertion plug 1631 and a second contact insertion plug 1632 located on the first contact insertion plug 1631. An upper surface of the first contact insertion plug 1631 may be configured to be higher than an upper surface of a bit line 131, so that a contact interface between the first contact insertion plug 1631 and the second contact insertion plug 1632 is higher than the bit line 131, thereby avoiding ions at the contact interface from penetrating into the bit line 131 and affecting device performance.

In the embodiment of the present disclosure, the first contact insertion plug 1631 may include a polysilicon layer, a metal silicide or a metal layer, and the second contact insertion plug 1632 may include a metal layer. As a specific example, the first contact insertion plug 1631 may be a silicon phosphide layer, and the second contact insertion plug 1632 may be made of tungsten.

Figure 2C:
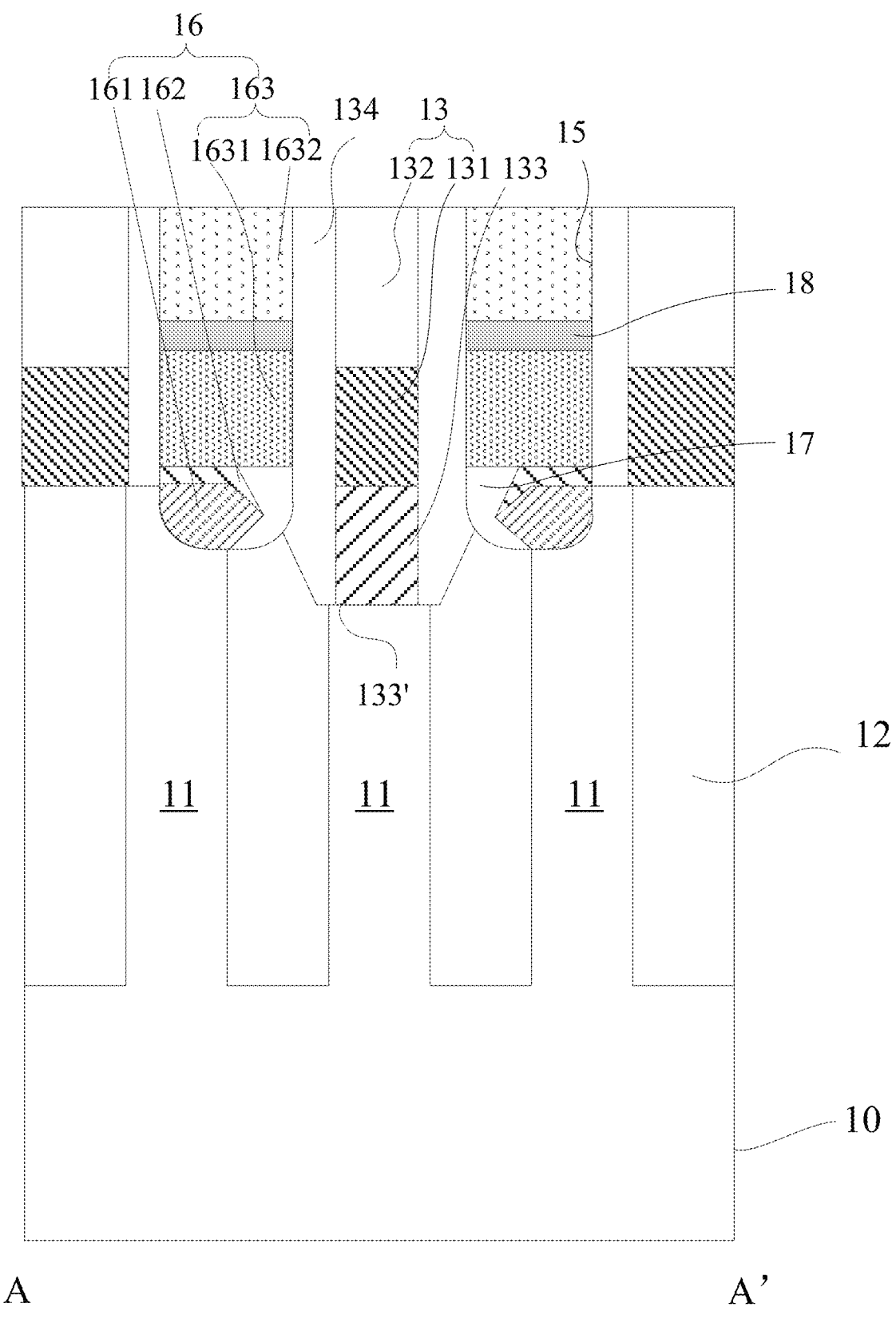
FIG. 2C is a schematic cross-sectional structural view along the line A-A' in FIG. 1 as provided in another embodiment of the present disclosure.

As another example, with reference to FIG. 2C, there is shown a schematic cross-sectional structural view along the line A-A' in FIG. 1 as provided in another embodiment of the present disclosure. The contact pad structure 16 may also include a heavily-doped semiconductor layer 18 located between the first contact insertion plug 1631 and the second contact insertion plug 1632, and contact resistance between the first contact insertion plug 1631 and the second contact insertion plug 1632 can be effectively reduced by providing the heavily-doped semiconductor layer 18.

The above embodiment provides a semiconductor device with contact pad structures 16 in respective contact holes 15. Each of the contact pad structures 16 is configured to include a first contact pad 161, a second contact pad 162 adaptively covering the first contact pad 161, and a contact plug 163 located on the second contact pad 162. The first contact pad 161 is in full contact with an active region 11 in a substrate 10, which can effectively reduce contact resistance. Moreover, by providing such contact pads in a stacking structure, the first contact pad 161 can function as a buffer layer for the second contact pad 162 so as to avoid doped ions in the second contact pad 162 from penetrating into the substrate 10 and affecting conductivity. In addition, an air gap 17 in each contact hole 15 is formed between the first contact pad 161, the second contact pad 162, the bit line spacer 134, the shallow trench isolation region 12 and a side wall on a side of the contact hole 15, which can effectively reduce an influence of the air gap 17 on the conductivity, thereby facilitating significant improvement of a conductivity characteristic of the semiconductor device.

Another aspect of the present disclosure further provides a method for preparing a semiconductor device. For details, reference can be made to the description in the following Embodiment Two.

Embodiment Two

Figure 4:
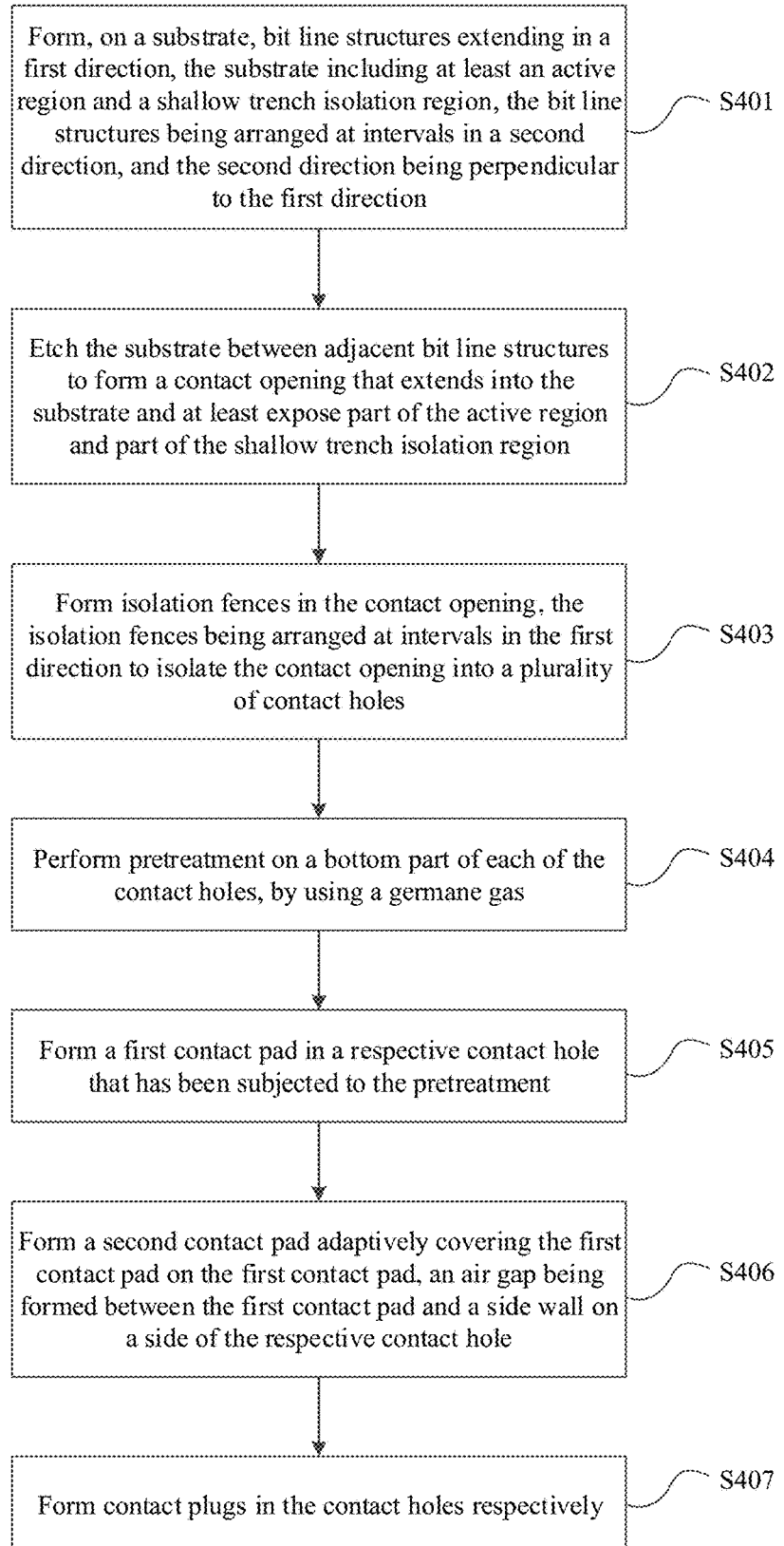
FIG. 4 is a schematic flowchart of a method for preparing a semiconductor device as provided in an embodiment of the present disclosure.

With reference to FIG. 4, there is shown a schematic flowchart of the method for preparing a semiconductor device as provided in an embodiment of the present disclosure, and the method includes the following steps S401 to S407.

At step S401, bit line structures 13 extending in a first direction are formed on a substrate 10, where the substrate 10 includes at least an active region 11 and a shallow trench isolation region 12, the bit line structures 13 are arranged at intervals in a second direction, and the second direction is perpendicular to the first direction.

At step S402, the substrate 10 between adjacent bit line structures 13 is etched to form a contact opening that extends into the substrate 10 and at least expose part of the active region 11 and part of the shallow trench isolation region 12.

At step S403, isolation fences 14 are formed in the contact opening, where the isolation fences 14 are arranged at intervals in the first direction to isolate the contact opening into a plurality of contact holes 15.

At step S404, pretreatment is performed on a bottom part of each of the contact holes 15 by using a germane gas.

At step S405, a first contact pad 161 is formed in a respective contact hole 15 that has been subjected to the pretreatment.

At step S406, a second contact pad 162 adaptively covering the first contact pad 161 is formed on the first contact pad 161, where an air gap 17 is formed between the first contact pad 161 and a side wall on a side of the respective contact hole 15.

At step S407, contact plugs 163 are formed in the contact holes 15, respectively.

Figure 5A:
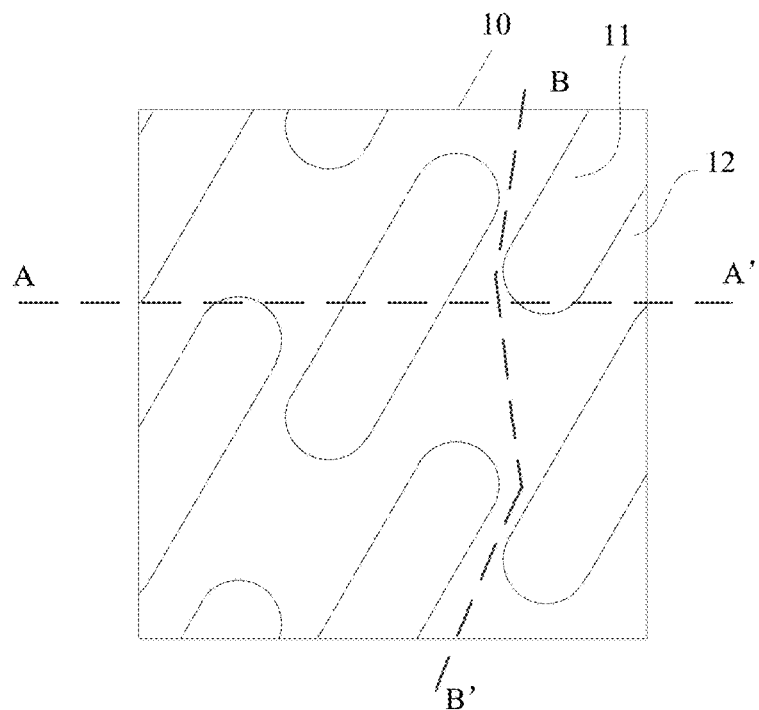
FIG. 5A is a schematic top structural view of a substrate 10.
Figure 5B:
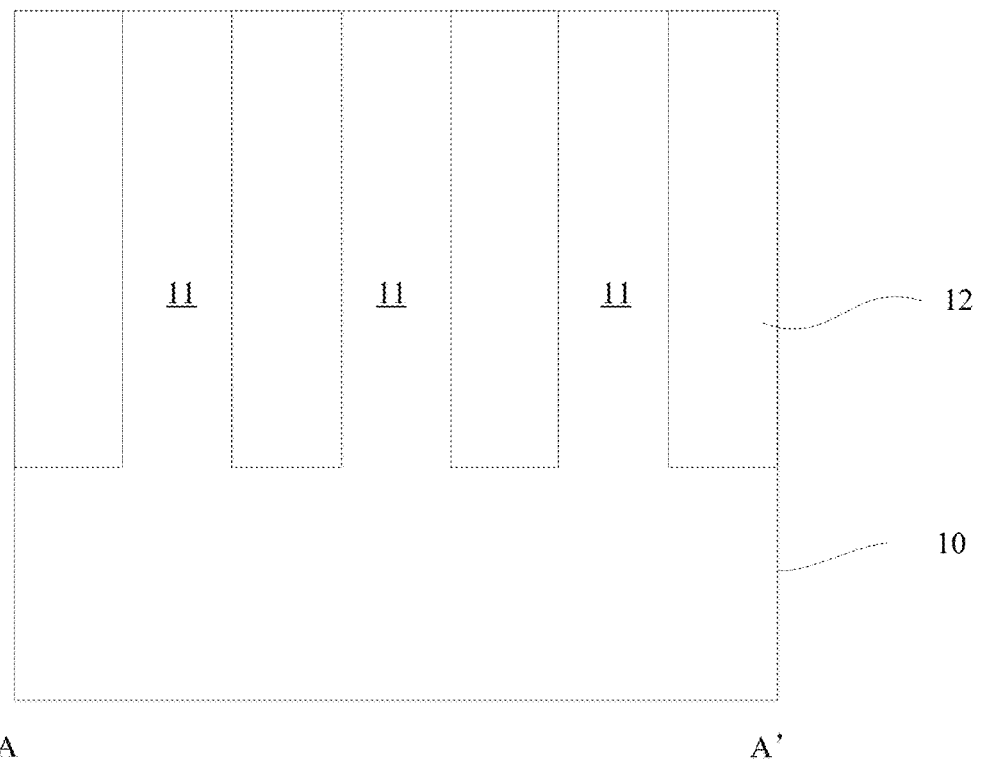
FIG. 5B is a schematic cross-sectional structural view along a line A-A' in FIG. 5A.

With reference to FIGS. 5A and 5B, FIG. 5A shows a schematic top structural view of a substrate 10, and FIG. 5B shows a schematic cross-sectional structural view along a line A-A' in FIG. 5A. The substrate 10 may include a semiconductor substrate. As an example, the substrate 10 may include a silicon substrate, a silicon-germanium substrate or a silicon substrate on an insulator. The substrate 10 may internally include the active region 11 and the shallow trench isolation region 12, and the shallow trench isolation region 12 may define the active region 11 into a plurality of areas.

Figure 5C:
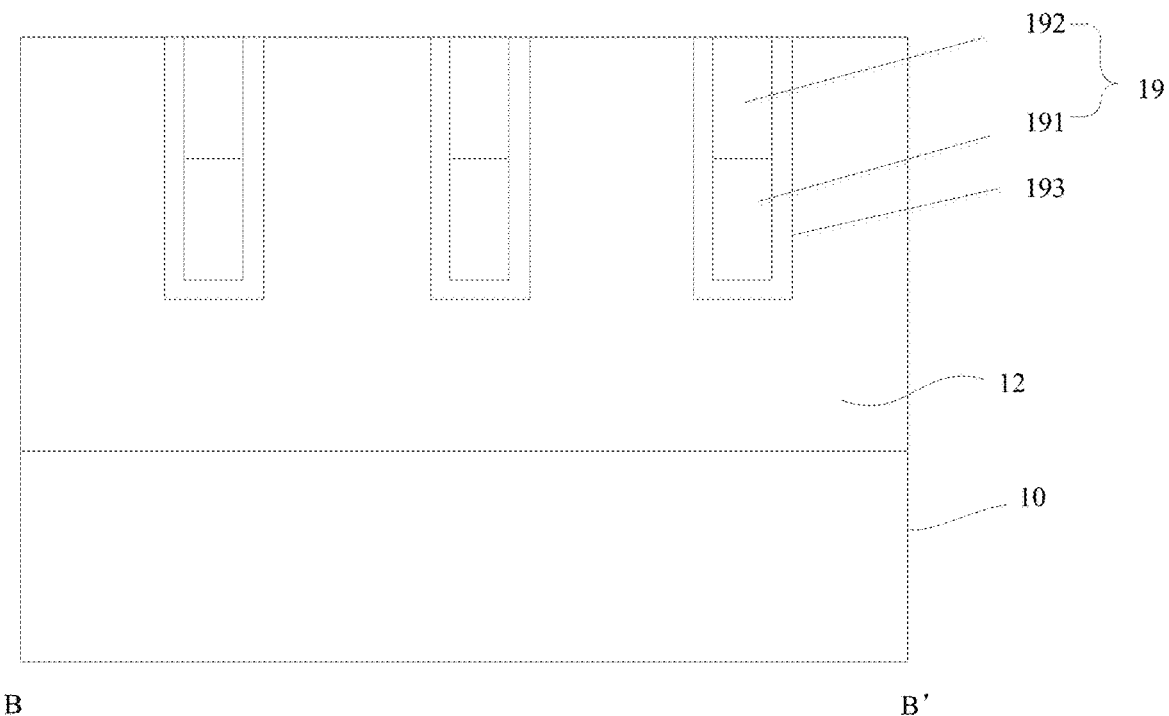
FIG. 5C is a schematic cross-sectional structural view along the line B-B' in FIG. 5A.

In the embodiment of the present disclosure, the first direction may be represented by D1, and the second direction perpendicular to the first direction may be represented by D2. In addition, with reference to FIG. 5C, there is shown a schematic cross-sectional structural view along a line B-B' in FIG. 5A. The substrate 10 may also be internally provided with buried word line structures 19. The buried word line structures 19 extend in the direction D2. Each of the buried word line structures 19 may include a word line 191 and an insulation isolation layer 192 located on the word line 191, and the buried word line structures 19 may be realized by means of a conventional approach in the art, which will not be described herein for brevity. In addition, dielectric layers 193 may also be arranged outside the buried word line structures 19, respectively, and the dielectric layers 193 may be oxide layers or nitride layers.

Figure 6A:
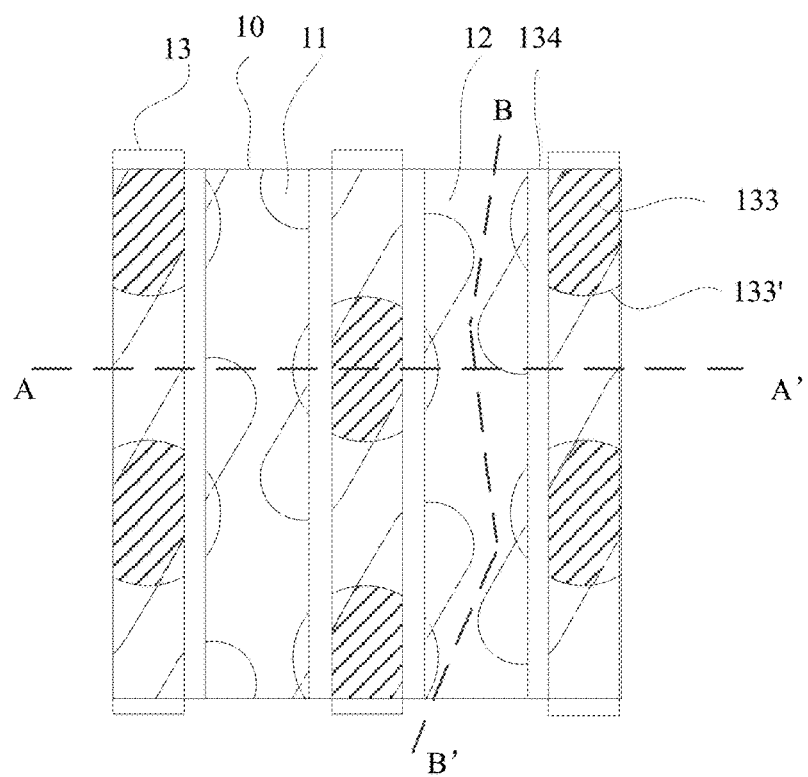
FIG. 6A is a schematic top structural view of a semiconductor device provided with bit line structures.
Figure 6B:
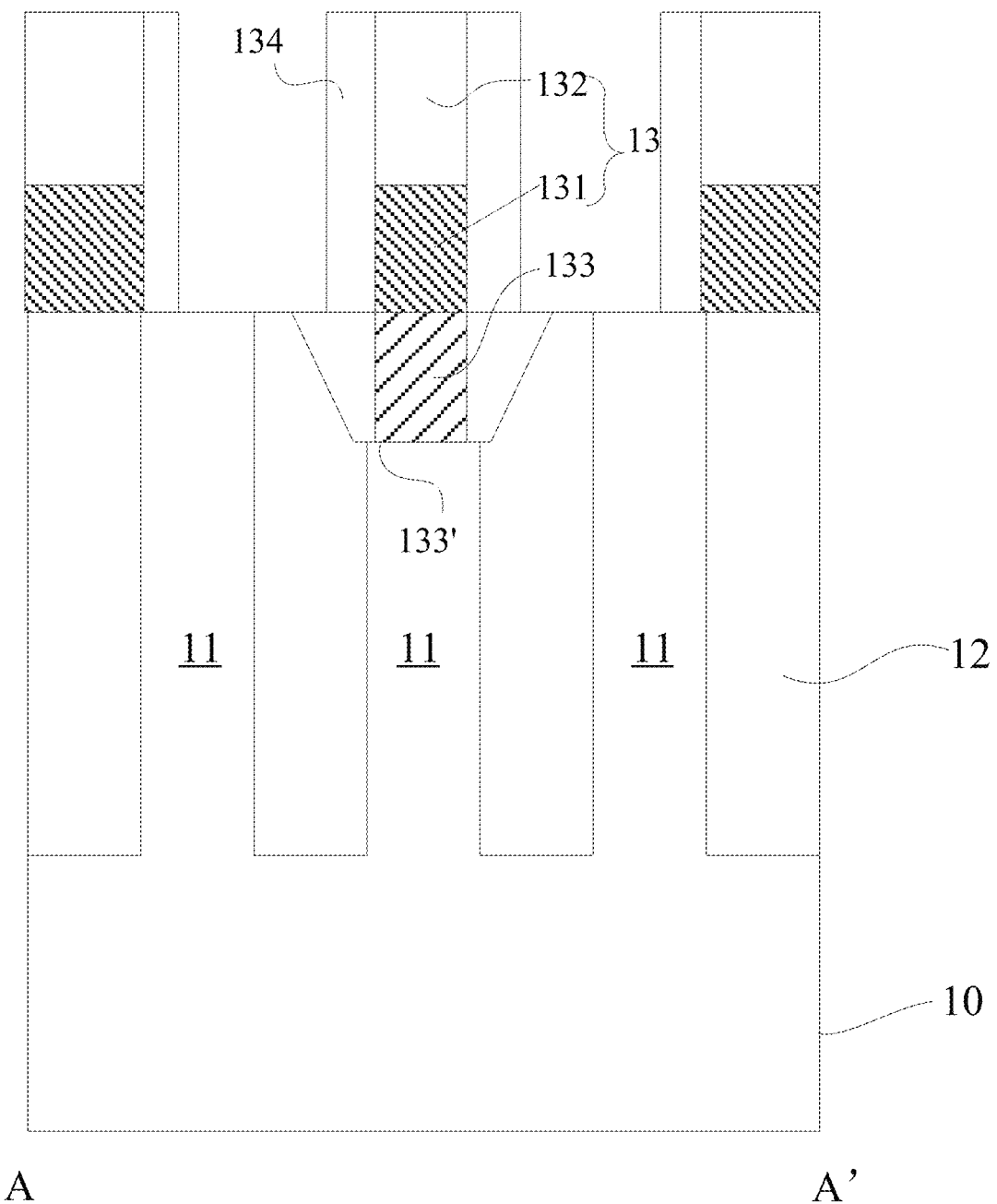
FIG. 6B is a schematic cross-sectional structural view along a line A-A' in FIG. 6A.
Figure 6C:
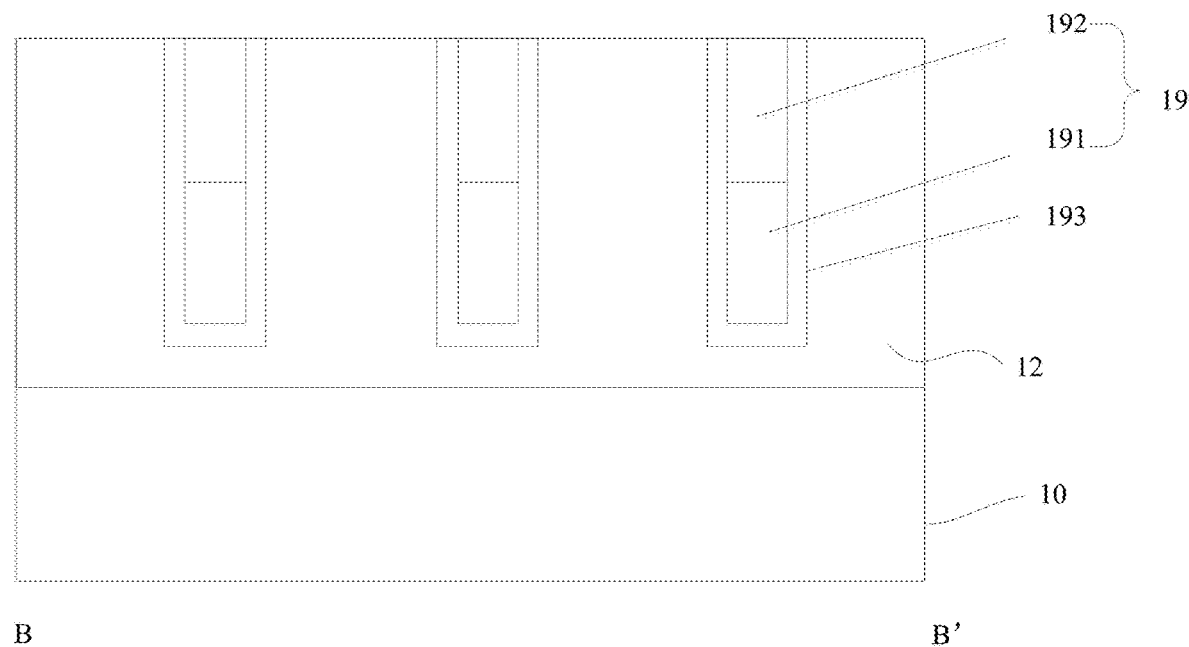
FIG. 6C is a schematic cross-sectional structural view along the line B-B' in FIG. 6B.

Step S401 may involve the following processes. Specifically, a hard mask layer is deposited and patterned on the substrate 10. The patterned hard mask layer is used as a mask to etch the substrate 10, so as to form bit line contact holes 133' in the substrate 10. A conductive material covering the bit line contact holes 133' is deposited, where an upper surface of the conductive material may be the same height as an upper surface of the substrate 10. A conductive layer covering the substrate 10 and the conductive material as well as a hard mask layer covering the conductive layer are deposited subsequently. And then the hard mask layer is patterned and the patterned hard mask layer is used as a mask to etch the conductive layer and the conductive material in the bit line contact holes 133', so as to form bit line structures 13 extending in the direction D1. The patterned conductive layer serves as the bit line 131, and the patterned conductive material forms the bit line contact plug 133. In addition, it is also possible to adaptively deposit bit line spacers 134. With reference to FIGS. 6A-6C, FIG. 6A shows a schematic top structural view of bit line structures, FIG. 6B shows a schematic cross-sectional structural view along a line A-A' in FIG. 6A, and FIG. 6C shows a schematic cross-sectional structural view along a line B-B' in FIG. 6B. The bit line structure 13 may have the same line width as the bit line contact plug 133 in the direction D2. Each adaptively deposited bit line spacers 134 may also fill in an air gap between the bit line contact plugs 133 and the bit line contact holes 133'.

Figure 7A:
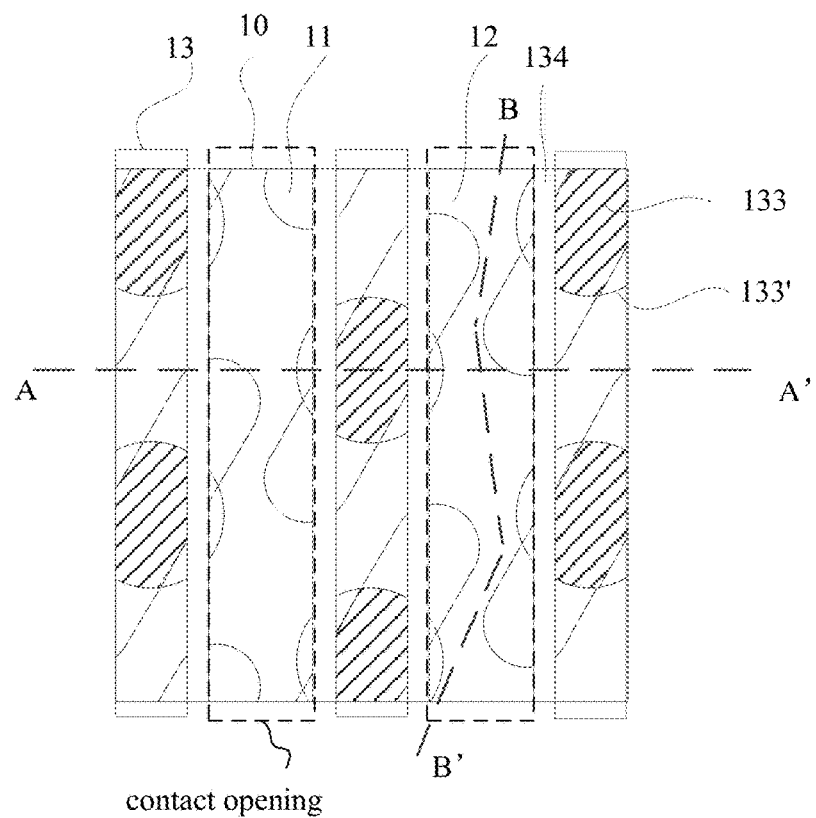
FIG. 7A is a schematic top structural view of a semiconductor device provided with a contact opening.
Figure 7B:
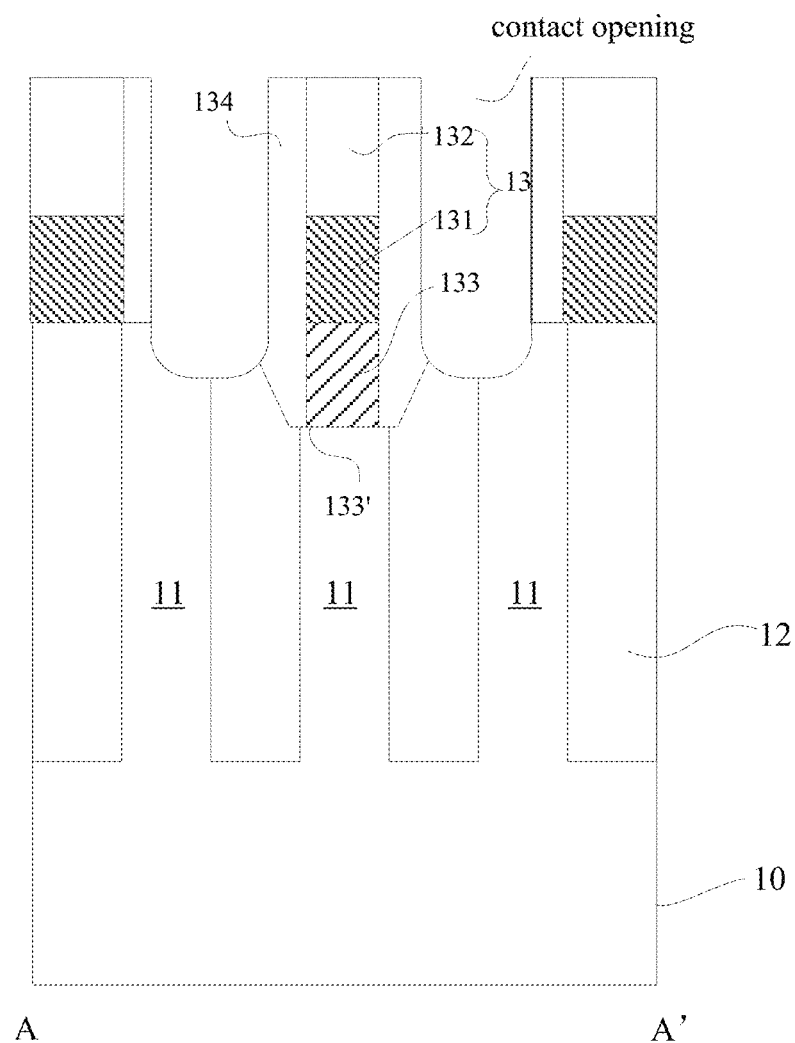
FIG. 7B is a schematic cross-sectional structural view along a line A-A' in FIG. 7A.
Figure 7C:
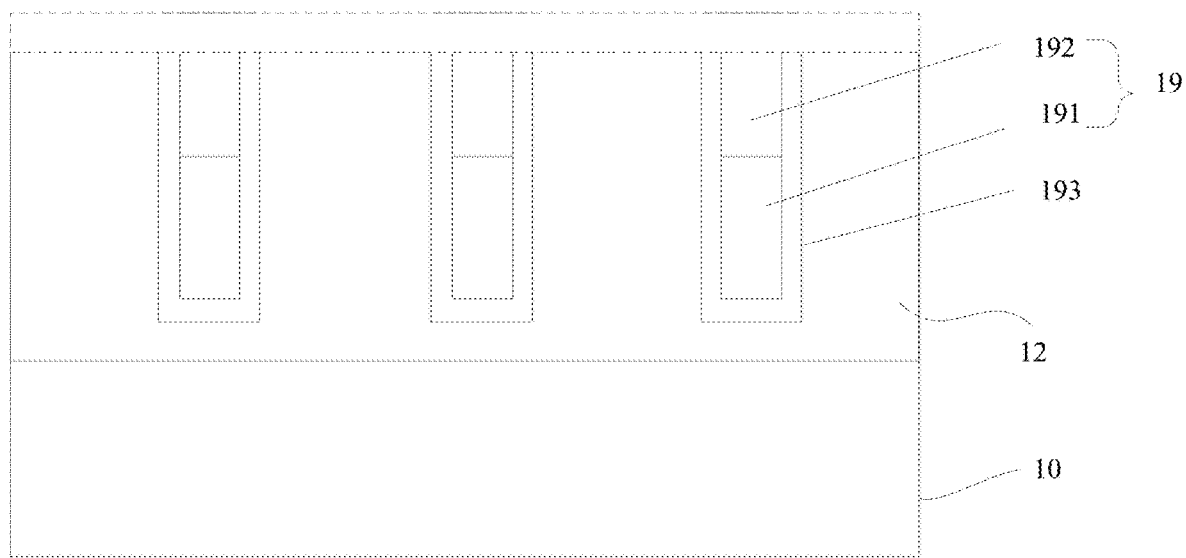
FIG. 7C is a schematic cross-sectional structural view along a line B-B' in FIG. 7A.

Step S402 may specifically involve: etching the substrate 10 between adjacent bit line structures 13 by means of a wet etching process or a dry etching process to form a contact opening that extends into the substrate 10 and at least expose part of the active region 11 and part of the shallow trench isolation region 12. Referring particularly to FIGS. 7A-7C, FIG. 7A shows a schematic top structural view of a semiconductor device provided with a contact opening, FIG. 7B shows a schematic cross-sectional structural view along a line A-A' in FIG. 7A, and FIG. 7C shows a schematic cross-sectional structural view along a line B-B' in FIG. 7A. A line width of the contact opening in the direction D1 may be a distance between the bit line spacers 134 of adjacent bit line structures 13. In another embodiment, the line width of the contact opening in the direction D1 may also be smaller than the distance between the bit line spacers 134 of adjacent bit line structures 13.

Figure 8A:
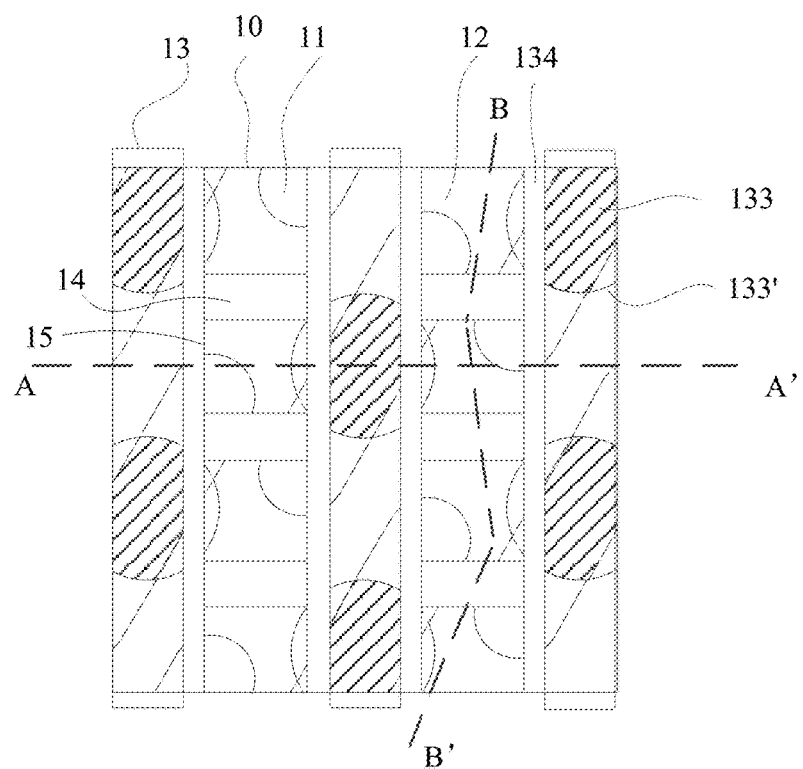
FIG. 8A is a schematic top structural view of a semiconductor device provided with contact holes 15.
Figure 8B:
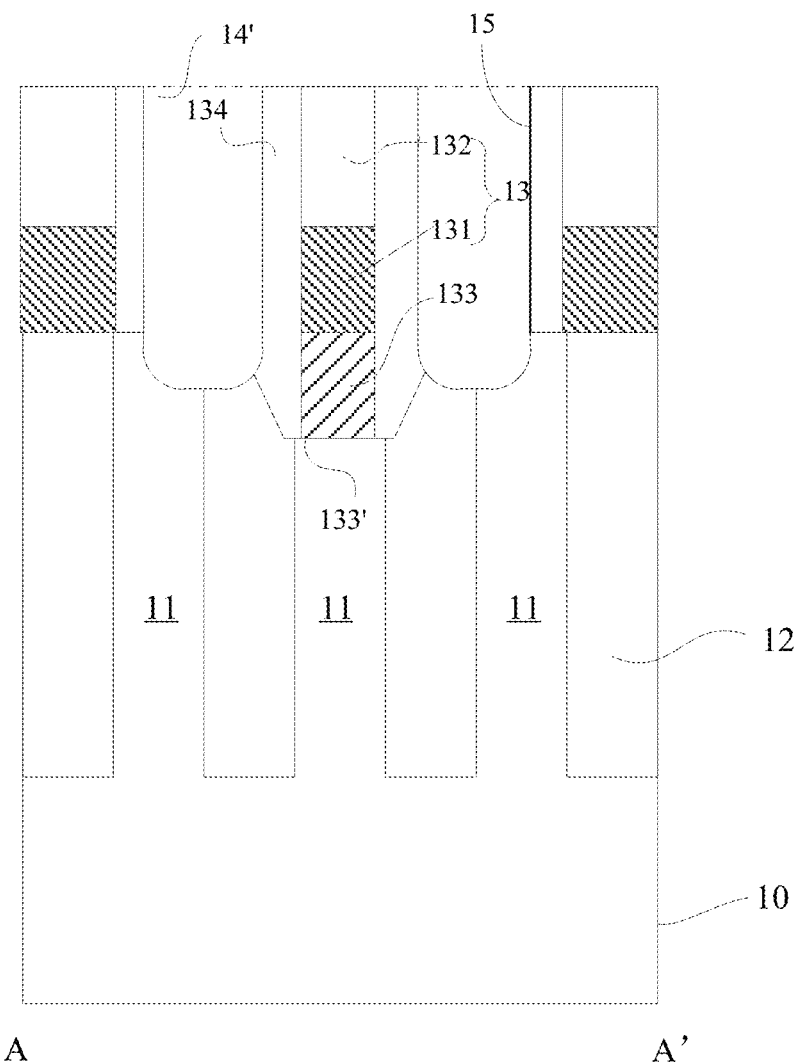
FIG. 8B is a schematic cross-sectional structural view along a line A-A' in FIG. 8A.
Figure 8C:
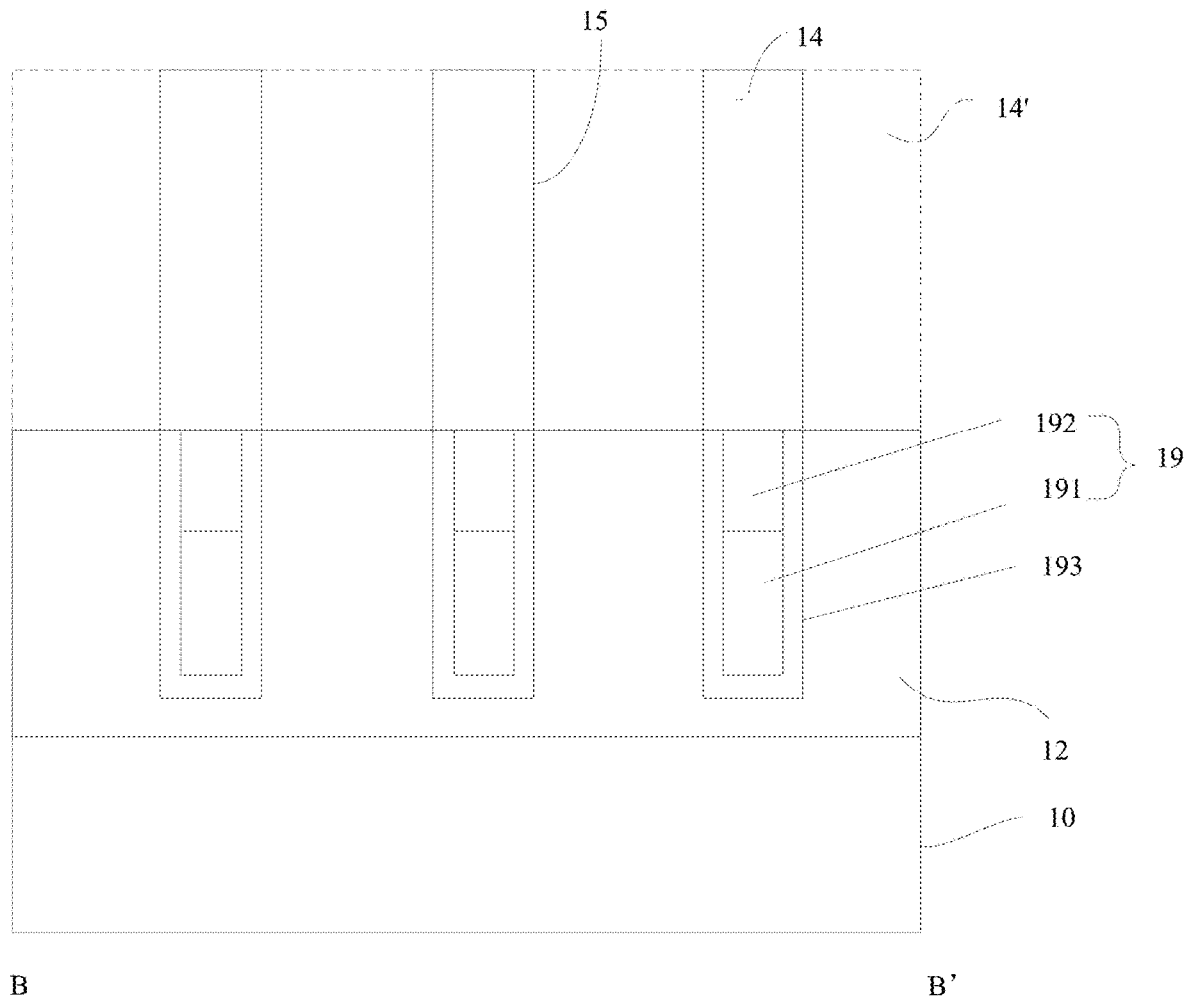
FIG. 8C is a schematic cross-sectional structural view along a line B-B' in FIG. 8A.

Step S403 may involve the following processes. Specifically, isolation material layers 14' are deposited in the contact opening, where the isolation material layers 14' may be at the same height as the bit line spacers 134 on top surfaces of the respective bit line structures 13. A mask layer covering the bit line spacers 134 and the isolation material layers 14' is deposited and patterned. The patterned mask layer is then used as a mask to etch the isolation material layers 14', so as to form the isolation fences 14 that are arranged at intervals in the first direction. Adjacent bit line structures 13 in the direction D2 and adjacent isolation fences 14 in the direction D1 may isolate the contact opening into a plurality of contact holes 15. Referring particularly to FIGS. 8A-8C, FIG. 8A shows a semiconductor device provided with contact holes 15, FIG. 8B shows a schematic cross-sectional structural view along a line A-A' in FIG. 8A, and FIG. 8C shows a schematic cross-sectional structural view along a line B-B' in FIG. 8A.

The isolation material layers 14' may be insulation material layers. As a specific example, the isolation material layers 14' may be silicon nitride layers.

Step S404 may specifically involve: performing pretreatment on a bottom part of each of the contact holes 15 by using a germane gas. The active region 11 exposed in the contact holes 15 is extremely easily oxidized to form an insulation layer. For example, when the substrate 10 is a silicon layer, silicon oxide would be formed on an upper surface of the active region 11, and germanium ions in germane can damage a silicon-oxygen bond, to form volatile germanium oxide, such that the insulation material of the active region 11 can be cleaned, thereby facilitating great conductivity between each of the contact pads and the active region 11.

Figure 9A:
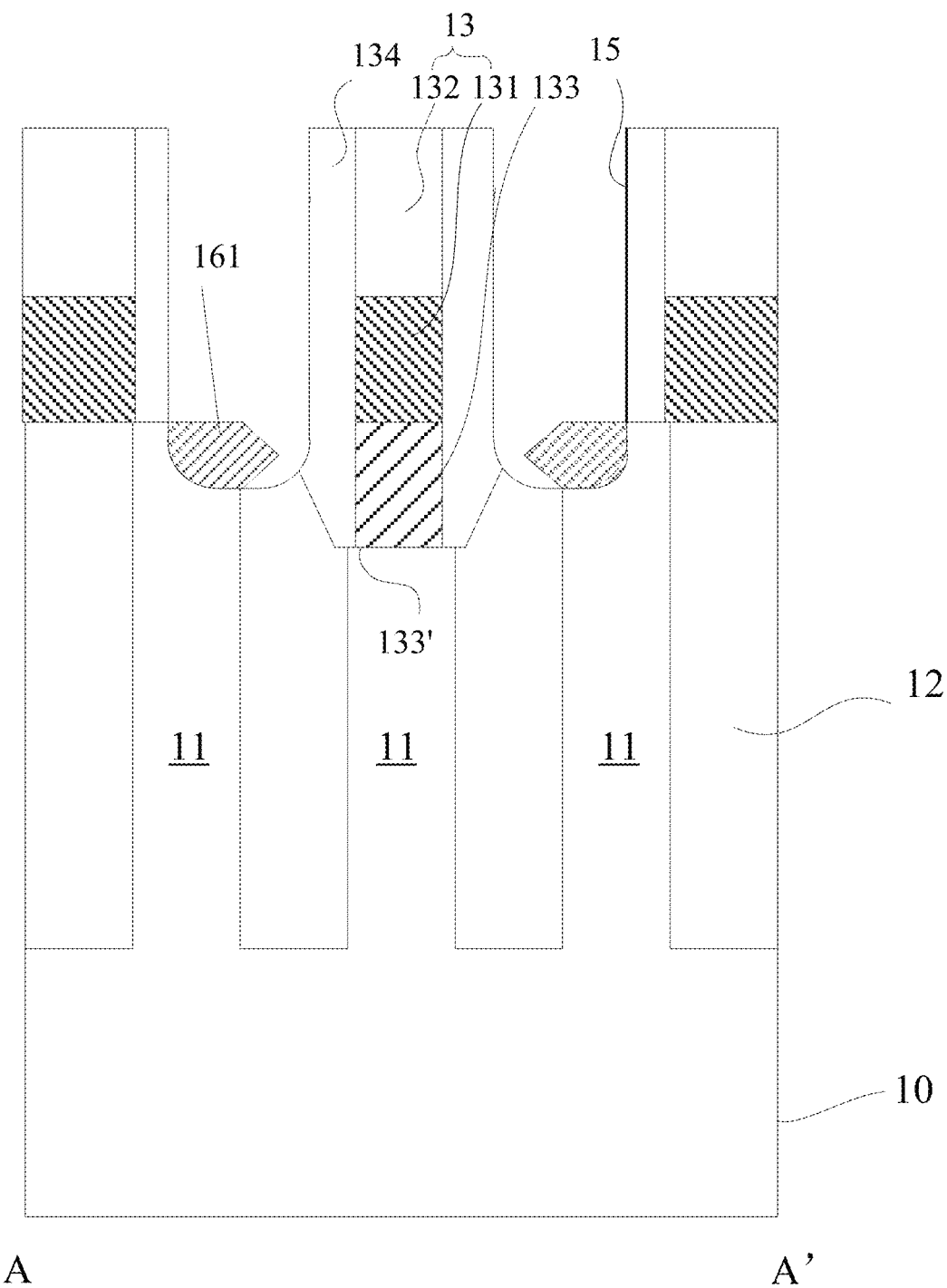
FIG. 9A is a schematic cross-sectional structural view, along the line A-A', of a semiconductor device provided with first contact pads 161.
Figure 9B:
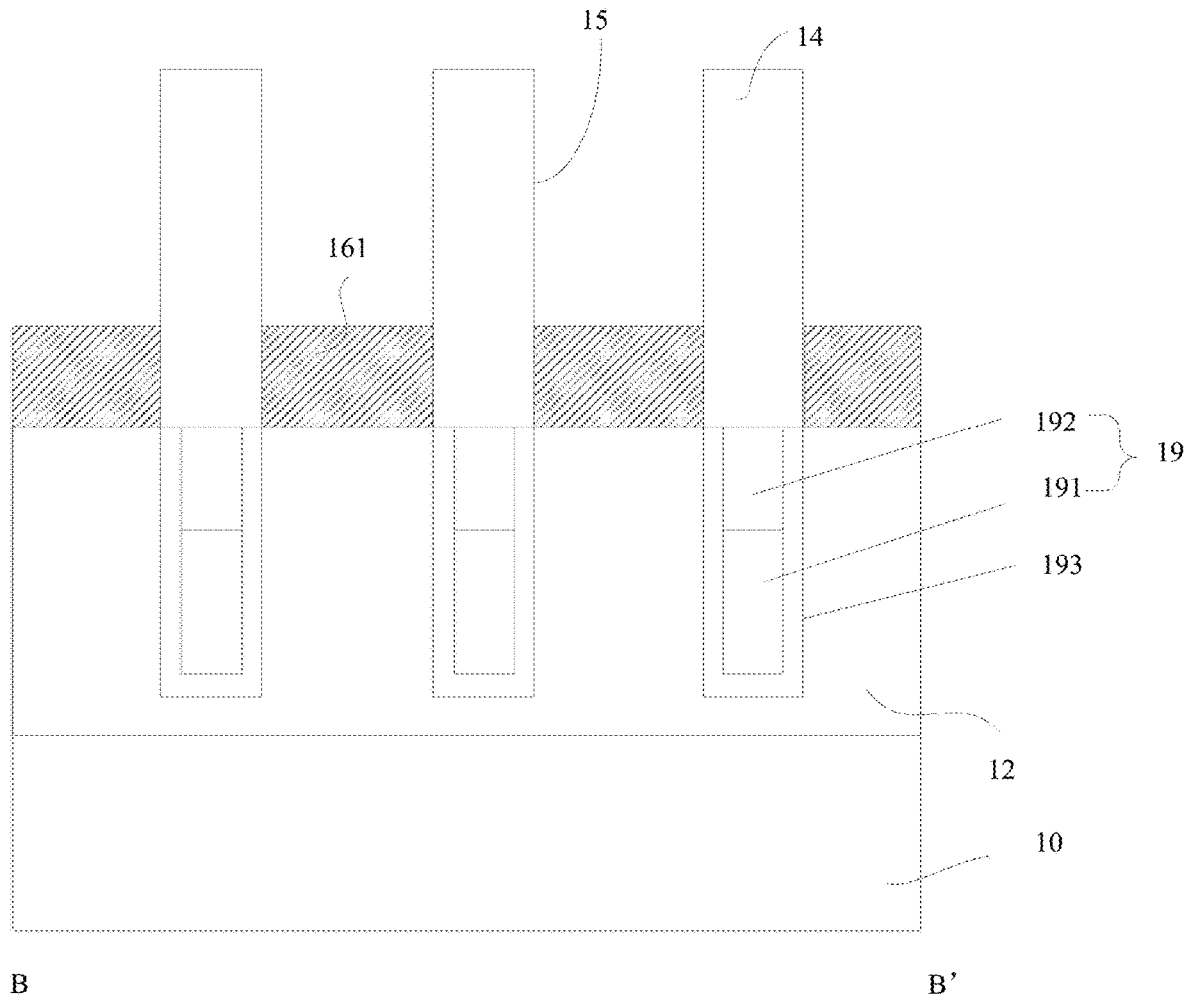
FIG. 9B is a schematic cross-sectional structural view, along the line B-B', of a semiconductor device provided with first contact pads 161.

Step S405 may specifically involve: forming, by means of a chemical vapor deposition process or a physical vapor deposition process, the first contact pad 161 in a respective contact hole 15 that has been subjected to the pretreatment. It is possible to control, by means of selecting a suitable deposition condition, the first contact pad 161 to be in contact with part of a substrate surface of the respective contact hole 15. As one example, the first contact pad 161 may be in contact with part of a surface of each of the active region 11 and the shallow trench isolation region 12 in the respective contact hole 15 (not shown in the figures). As another example, the first contact pad 161 may be formed, by a selective epitaxial growth process, on the active region 11 in the respective contact hole 15 that has been subjected to the pretreatment. The first contact pad 161 is only in contact with the active region 11. As a specific example, the first contact pad 161 may be formed, by using the selective epitaxial growth process with silicane and germane as a precursor, on the active region 11 in the respective contact hole 15 that has been subjected to pretreatment. By using the selective epitaxial growth process, a bottom part of the first contact pad 161 is only in contact with the active region 11. Referring particularly to FIGS. 9A and 9B, FIG. 9A shows a schematic cross-sectional structural view, along the line A-A', of a semiconductor device provided with first contact pads 161, and FIG. 9B shows a schematic cross-sectional structural view, along the line B-B', of a semiconductor device provided with first contact pads 161.

Figure 10A:
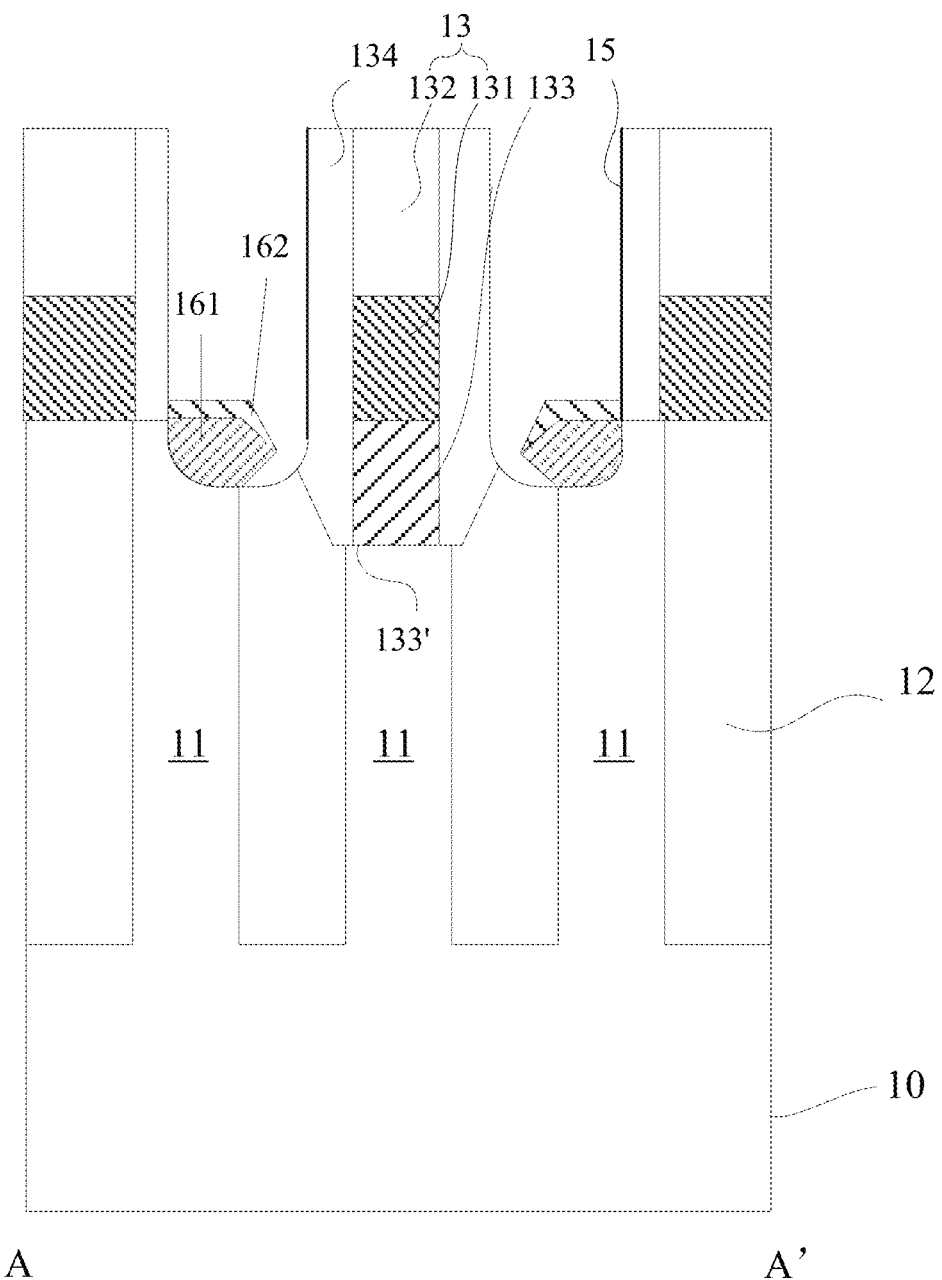
FIG. 10A is a schematic cross-sectional structural view, along the line A-A', of a semiconductor device provided with second contact pads 162.
Figure 10B:
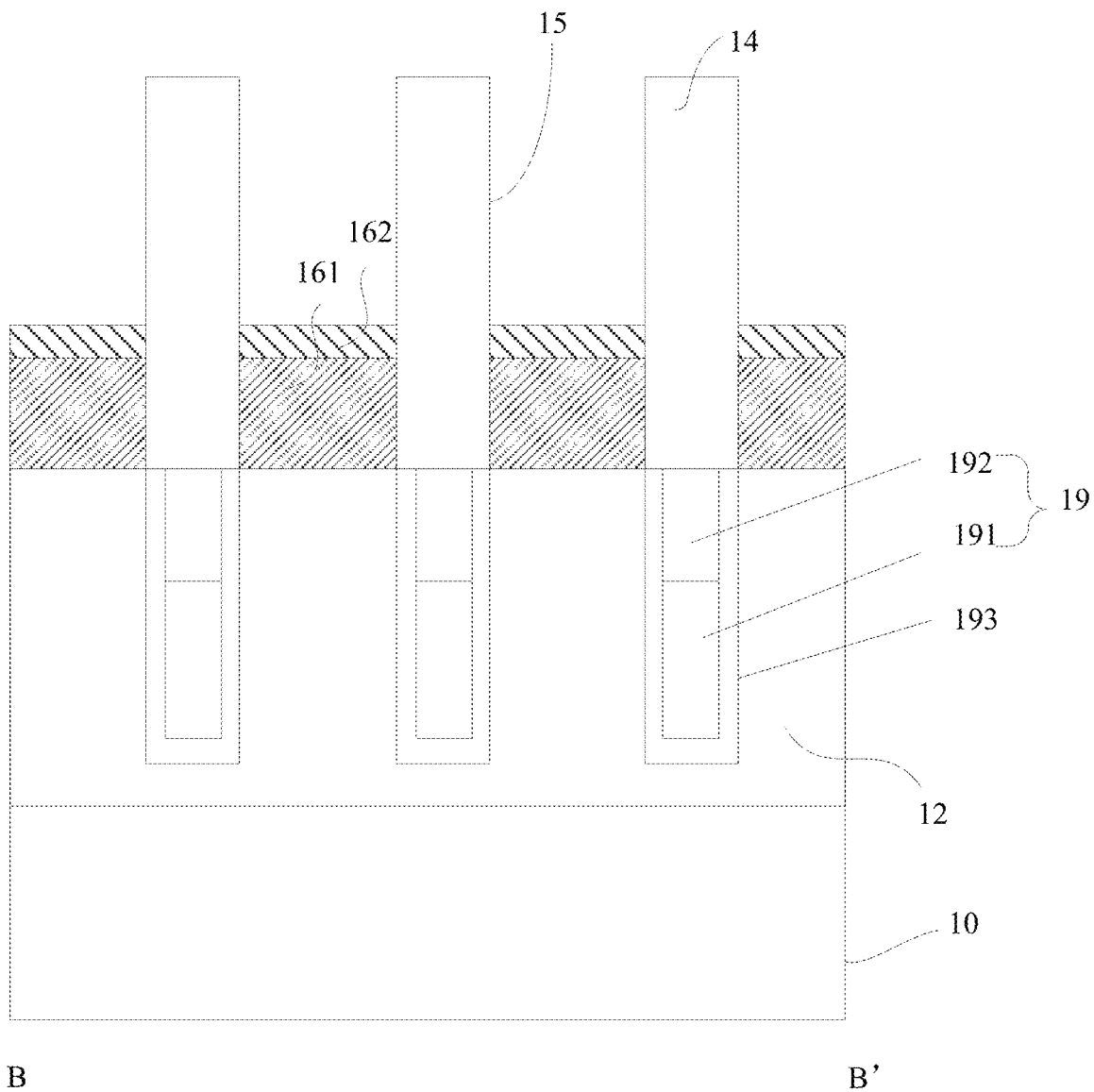
FIG. 10B is a schematic cross-sectional structural view, along the line B-B', of a semiconductor device provided with second contact pads 162.

Step S406 may specifically involve: forming, on the first contact pad 161 and by using the selective epitaxial growth process, the second contact pad 162 adaptively covering the first contact pad 161. The second contact pad 162 and the first contact pad 161 have different chemical compositions. For example, the second contact pad 162 may be formed from a material different from that of the first contact pad 161, and the second contact pad 162 may also be formed from the same material as that of the first contact pad 161 but with a different ion doping concentration. As a specific example, the second contact pad 162 adaptively covering the first contact pad 161 is formed on the respective first contact pad 161 by using the selective epitaxial growth process with silicane and germane as a precursor. Referring particularly to FIG. 10A, there is shown a schematic cross-sectional structural view, along the line A-A', of a semiconductor device provided with second contact pads 162. As an example, an upper surface of each of the second contact pads 162 may be higher than a lower surface of each of the bit lines 131. FIG. 10B also shows a schematic cross-sectional structural view, along the line B-B', of a semiconductor device provided with second contact pads 162. After each second contact pad 162 is formed by using the selective epitaxial growth process, an air gap may be formed between each of the first contact pad 161 and the second contact pad 162 and a side wall on a side of the respective contact hole 15.

It should be noted that since the contact hole 15 has a larger aspect ratio and the first contact pad 161 is in contact with part of the substrate surface of the respective contact hole 15, an air gap will be formed between the first contact pad 161 and each of a side wall on a side of the respective contact hole 15 and a bottom surface of the respective contact hole 15 after the first contact pad 161 and the second contact pad 162 are both formed, but such an air gap may not be able to be completely filled when the contact plugs 163 are subsequently formed by using a depositing process.

Figure 11A:
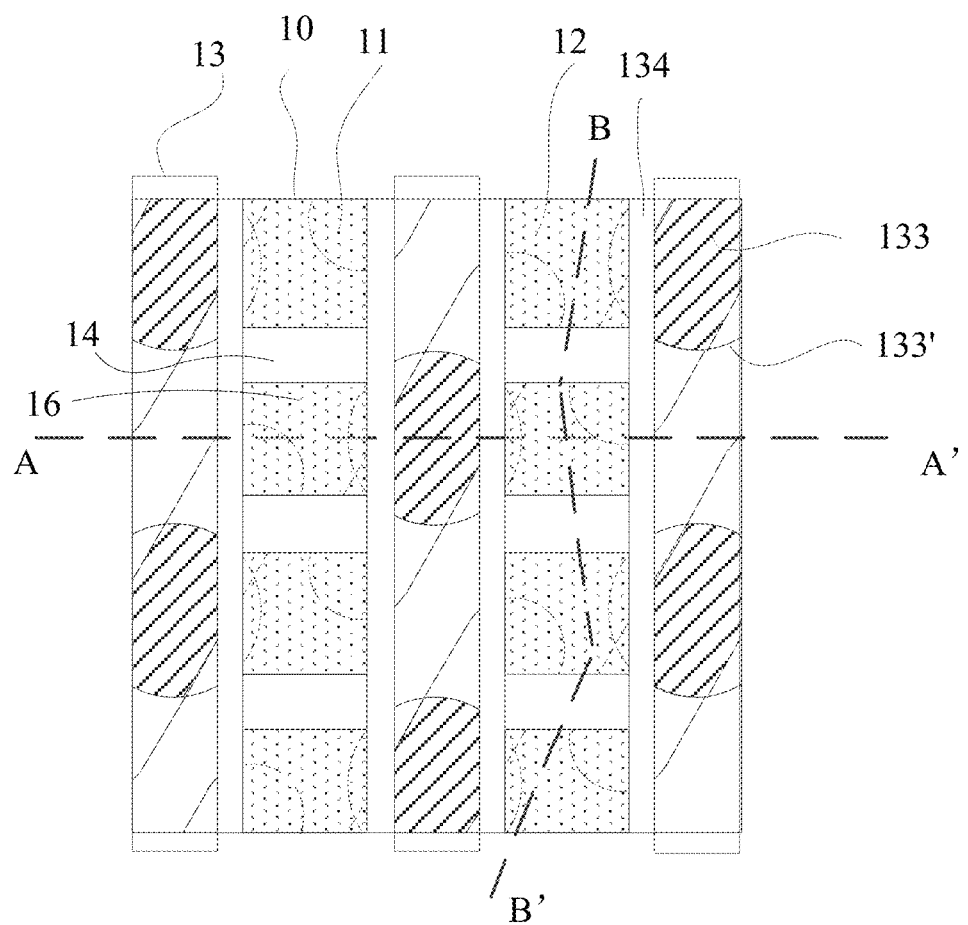
FIG. 11A is a schematic top structural view of a semiconductor device provided with contact plugs 163.
Figure 11B:
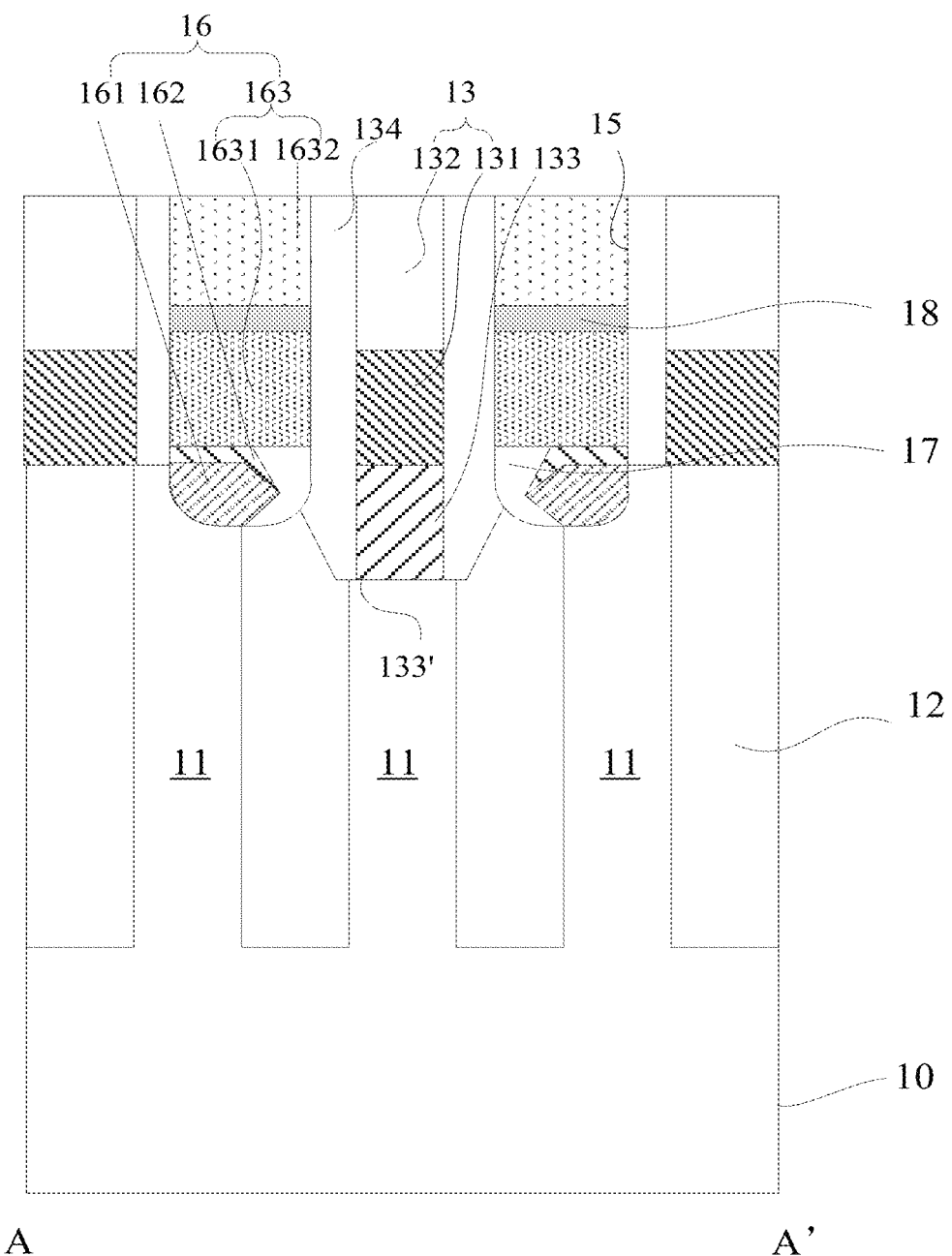
FIG. 11B is a schematic cross-sectional structural view along a line A-A' in FIG. 11A.
Figure 11C:
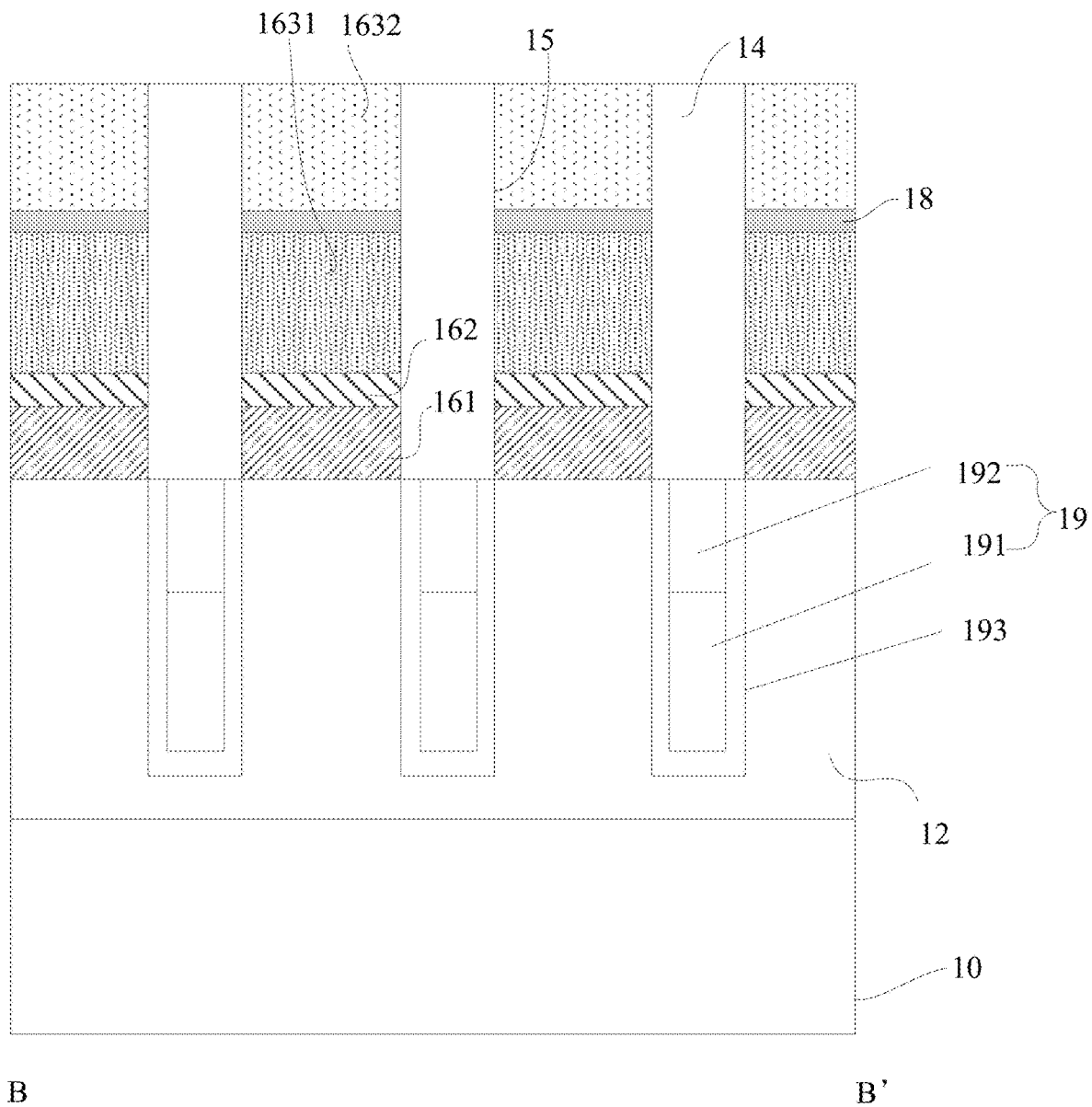
FIG. 11C is a schematic cross-sectional structural view along a line B-B' in FIG. 11A.

As an example, step S407 may specifically involve: forming a respective contact plug 163 on a respective second contact pad 162 by means of a chemical vapor deposition process or a physical vapor deposition process. Process conditions are controlled in such a way that the contact plug 163 only covers part of the surface of the respective second contact pad 162, and the air gap 17 is formed between each of the first contact pads 161 and the second contact pads 162 and the respective contact hole 15, as depicted in FIG. 11B for details. As another example, step S407 may specifically involve: forming a respective contact plug 163 on a respective second contact pad 162 by choosing a depositing process with a better step coverage characteristic, such that the contact plug 163 covers the second contact pad 162, and is in contact with part of the respective first contact pad 161, the air gap between each of the first contact pad 161 and the second contact pad 162 and the respective contact hole 15 is partially filled, and the air gap 17 is still reserved between the first contact pad 161 and a bottom part of the respective contact hole 15, as depicted in FIG. 2B in Embodiment One for details. Hereinafter, descriptions will be made based on the example that a contact plug 163 covering part of a surface of a respective second contact pad 162 is formed in a respective contact hole 15. With reference to FIGS. 11A-11C, FIG. 11A shows a schematic top structural view of a semiconductor device provided with contact plugs 163, and FIG. 11B shows a schematic cross-sectional structural view along a line A-A' in FIG. 11A. An upper surface of a first contact insertion plug 1631 may be higher than an upper surface of a bit line 131, so that a contact interface between the first contact insertion plug 1631 and a second contact insertion plug 1632 is higher than the bit line 131, thereby avoiding ions at the contact interface from penetrating into the bit line 131 and affecting device performance. FIG. 11C shows a schematic cross-sectional structural view along a line B-B' in FIG. 11A.

Step S407 may also specifically involve: depositing, by means of the chemical vapor deposition process or the physical vapor deposition process, a polysilicon layer, a metal silicide or a metal layer in a respective contact hole 15 as its first contact insertion plug 1631; and depositing a metal layer in the respective contact hole 15 to form its second contact insertion plug 1632 covering the first contact insertion plug 1631. The first contact pad 161, the second contact pad 162, the first contact insertion plug 1631 and the second contact insertion plug 1632 may form the contact pad structure 16.

As an example, the first contact insertion plug 1631 may be a silicon phosphide layer, and the second contact insertion plug 1632 may be made of tungsten. When the first contact insertion plug 1631 is made of the same material as the second contact pad 162, the growth rate of the first contact insertion plug 1631 may be greater than that of the second contact pad 162.

It should be noted that after the polysilicon layer, the metal silicide or the metal layer is formed in the respective contact hole 15 as the first contact insertion plug 1631, a heavily-doped semiconductor layer 18 covering the first contact insertion plug 1631 may also be deposited.

The above embodiment provides a method for preparing a semiconductor device. In this method, pretreatment is performed on a bottom part of each contact hole 15 by using a germane gas, first contact pads 161 and second contact pads 162 adaptively covering the respective first contact pads 161 grow on an active region 11 by using a selective epitaxial growth process, to form contact plugs 163 in the contact holes 15, respectively, such that the first contact pads 161 are in full contact with the active region 11 in a substrate 10, which can effectively reduce contact resistance. Moreover, by providing contact pads in the form of a stacking structure, each of the first contact pads can function as a buffer layer for a respective second contact pad 162 so as to avoid doped ions in the second contact pad 162 from penetrating into the substrate 10 and affecting conductivity. In addition, an air gap 17 in each contact hole 15 is formed between the first contact pad 161 and a side wall on a side of the contact hole 15, which can effectively reduce an influence of the air gap on the conductivity, thereby facilitating significant improvement of a conductivity characteristic of the semiconductor device.

Although various implementations are disclosed herein, it should be understood that they have been presented for facilitating the understanding of the present disclosure, rather than limiting the scope of the present disclosure. A skilled person in the art can make any modification and change to the form and details of the implementation without departing from the spirit and scope of the present disclosure, and the scope of the present disclosure shall be defined in the appended claims.

What is claimed is:

1. A method for preparing a semiconductor device, comprising:
   forming bit line structures extending in a first direction on a substrate, wherein the substrate comprises at least an active region and a shallow trench isolation region, the bit line structures are arranged at intervals in a second direction, and the second direction is perpendicular to the first direction;
   etching the substrate between adjacent bit line structures to form a contact opening that extends into the substrate and at least expose part of the active region and part of the shallow trench isolation region;
   forming isolation fences in the contact opening, wherein the isolation fences are arranged at intervals in the first direction to isolate the contact opening into a plurality of contact holes;
   performing pretreatment on a bottom part of each of the contact holes;
   forming a plurality of first contact pads in the respective contact holes;
   forming a second contact pad adaptively covering the first contact pad, wherein an air gap is formed between the first contact pad and a side wall on a side of the respective contact hole; and
   forming contact plugs in the contact holes, respectively.

2. The method according to claim 1, wherein the first contact pad is in contact with part of a substrate surface.

3. The method according to claim 2, further comprises:
   forming the first contact pad by using a selective epitaxial growth process.

4. The method according to claim 1, further comprises:
   forming the second contact pad adaptively covering the first contact pad, wherein the air gap is among of first contact pad, the second contact pad and the side wall on a side of the respective contact hole.

5. The method according to claim 1, further comprises:
   forming a contact plug covering the respective second contact pad and in contact with part of a surface of the respective first contact pad.

6. The method according to claim 1, further comprises:
   forming a polysilicon layer, a metal silicide or a metal layer in the respective contact hole as first contact insertion plug, and depositing a metal layer to form second contact insertion plug covering the first contact insertion plug.

7. The method according to claim 6, wherein the first contact insertion plug is made of the same material as the second contact pad, and a growth rate of the first contact insertion plug is greater than a growth rate of the second contact pad.

8. The method according to claim 6, wherein after the step of forming the polysilicon layer, the metal silicide or the metal layer in the respective contact hole as the first contact insertion plug, the method further comprises:
   depositing a heavily-doped semiconductor layer covering the first contact insertion plug.

9. The method according to claim 6, wherein an upper surface of the second contact pad is higher than a lower surface of the bit line, and an upper surface of the first contact insertion plug is higher than an upper surface of the bit line.

10. The method according to claim 1, further comprises:
    depositing a conductive layer covering the substrate and a hard mask layer covering the conductive layer; and
    patterning the conductive layer and the hard mask layer, wherein the patterned conductive layer serves as a bit line, and the patterned hard mask layer is located on the bit line.

* * * * *